US012644913B2

(12) United States Patent

Ogawa et al.

(10) Patent No.: US 12,644,913 B2

(45) Date of Patent: Jun. 2, 2026

(54) ELECTROMAGNETIC WAVE DETECTOR AND ELECTROMAGNETIC WAVE DETECTOR ARRAY

(71) Applicant: Mitsubishi Electric Corporation, Tokyo (JP)

(72) Inventors: Shimpei Ogawa, Tokyo (JP); Masaaki Shimatani, Tokyo (JP); Shoichiro Fukushima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 241 days.

(21) Appl. No.: 18/701,268

(22) PCT Filed: Dec. 5, 2022

(86) PCT No.: PCT/JP2022/044762

§ 371 (c)(1),
(2) Date: Apr. 15, 2024

(87) PCT Pub. No.: WO2023/112751

PCT Pub. Date: Jun. 22, 2023

(65) Prior Publication Data

US 2024/0426887 A1 Dec. 26, 2024

(30) Foreign Application Priority Data

Dec. 13, 2021 (JP) .................................. 2021-201601

(51) Int. Cl.
*G01R 29/08* (2006.01)
*H10N 15/10* (2023.01)
(52) U.S. Cl.
CPC ......... *G01R 29/0878* (2013.01); *H10N 15/15* (2023.02)

(58) Field of Classification Search
CPC ..... G01R 29/08; G01R 29/0878; H10F 30/20; H10F 30/227; H10N 15/10; H10N 15/15
See application file for complete search history.

(56) References Cited

U.S. PATENT DOCUMENTS

| | | | | |
|---|---|---|---|---|
| 3,604,933 A | * | 9/1971 | Cross | ........................ G01J 5/34 |
| | | | | 250/338.2 |
| 2018/0144849 A1 | | 5/2018 | Jonker | |
| 2020/0052146 A1 | * | 2/2020 | Ogawa | .................. G01J 1/0429 |

FOREIGN PATENT DOCUMENTS

| | | | |
|---|---|---|---|
| CN | 108198876 A | 6/2018 | |
| CN | 111370523 A * | 7/2020 | ........... H10F 71/137 |
| WO | 2018/012076 A1 | 1/2018 | |

OTHER PUBLICATIONS

English translation CN111370523A (Year: 2020).*

(Continued)

*Primary Examiner* — Eman A Alkafawi

*Assistant Examiner* — Courtney G McDonnough

(74) *Attorney, Agent, or Firm* — XSENSUS LLP

(57) ABSTRACT

An electromagnetic wave detector includes: a two-dimensional material layer including a first region and a second region disposed side by side in a first direction; a first electrode portion and a second electrode portion spaced from each other in the first direction and electrically connected to each other via the first region and the second region of the two-dimensional material layer; a first ferroelectric layer having a portion overlapping with the first region of the two-dimensional material layer in a plan view; and a second ferroelectric layer having a portion overlapping with the second region of the two-dimensional material layer in the plan view. The first ferroelectric layer and the second ferroelectric layer are provided such that, when irradiated (Continued)

with an electromagnetic wave, a voltage change that occurs in the first region is different from a voltage change that occurs in the second region.

20 Claims, 12 Drawing Sheets

(56)                    References Cited

OTHER PUBLICATIONS

International Search Report and Written Opinion mailed on Feb. 21, 2023, received for PCT Application PCT/JP2022/044762, filed on Dec. 5, 2022, 13 pages including English Translation.

* cited by examiner

1a          X          1b          102

4a  4a  4a    4b  4b    1

2a                                      2b
4a                                      4b
                                        3

43a  43a  43a  43c  43b  43b 4a                              4b

Y
|
→X 43a  43c  43b 1a          1b 44a  44a  44a    44b  44b    1

2a                              2b
4a                              4b
                                3

→X    40

104

X

105

X

ELECTROMAGNETIC WAVE DETECTOR AND ELECTROMAGNETIC WAVE DETECTOR ARRAY

CROSS-REFERENCE TO RELATED APPLICATIONS

This application is a national stage application, pursuant to 35 U.S.C. § 371, of International Patent Application No. PCT/JP2022/044762, filed Dec. 5, 2022, which claims the priority to the Japanese Patent Application No. 2021-201601, filed on Dec. 13, 2021, the entire contents of each are incorporated herein by reference.

TECHNICAL FIELD

The present disclosure relates to an electromagnetic wave detector and an electromagnetic wave detector array.

BACKGROUND ART

As a next-generation electromagnetic wave detector, there has been known an electromagnetic wave detector including a two-dimensional material layer such as graphene as an electromagnetic wave detection layer, for example. The two-dimensional material layer has very high mobility, but has a relatively low quantum efficiency. In recent years, sensitivity of such an electromagnetic wave detector including the two-dimensional material layer has been increased.

For example, WO 2018/012076 (PTL 1) proposes an electromagnetic wave detector including a ferroelectric layer disposed below or above a graphene layer connected between a source electrode and a drain electrode.

In the detector, when an electromagnetic wave enters, in particular, when an electromagnetic wave in an infrared wavelength range enters, the ferroelectric layer exhibits a pyroelectric effect. This pyroelectric effect causes a change in dielectric polarization in the ferroelectric layer, with the result that a gate voltage of the graphene layer is modulated. Since the graphene layer has large atomic layer thickness and high charge mobility, a slight change in gate voltage leads to an enormous change in current response. Such an effect is referred to as a photogating effect. High sensitivity can be realized by this photogating effect.

CITATION LIST

Patent Literature

PTL 1: WO 2018/012076

SUMMARY OF INVENTION

Technical Problem

The sensitivity of the electromagnetic wave detector described in PTL 1 above depends on the magnitude of a polarization voltage generated in the ferroelectric layer due to the pyroelectric effect. On the other hand, the ferroelectric layer generally has low response speed. In the electromagnetic wave detector described above, therefore, increasing the thickness of the ferroelectric layer in order to increase the polarization voltage generated in the ferroelectric layer results in reduced response speed. As a result, improvement in the sensitivity of the electromagnetic wave detector described above is limited when considering its application as a sensor.

It is a main object of the present disclosure to provide an electromagnetic wave detector and an electromagnetic wave detector array that can have improved sensitivity as compared to the electromagnetic wave detector described above.

Solution to Problem

An electromagnetic wave detector according to the present disclosure includes: a two-dimensional material layer including a first region and a second region disposed side by side in a first direction; a first electrode portion and a second electrode portion spaced from each other in the first direction and electrically connected to each other via the first region and the second region of the two-dimensional material layer; a first ferroelectric layer having a portion overlapping with the first region of the two-dimensional material layer in a plan view; and a second ferroelectric layer having a portion overlapping with the second region of the two-dimensional material layer in the plan view. A boundary between the first ferroelectric layer and the second ferroelectric layer intersects the first direction. A material of each of the first ferroelectric layer and the second ferroelectric layer is a pyroelectric substance. The first ferroelectric layer and the second ferroelectric layer are provided such that, when irradiated with an electromagnetic wave, a voltage change that occurs in the first region is different from a voltage change that occurs in the second region.

Advantageous Effects of Invention

According to the present disclosure, there can be provided an electromagnetic wave detector and an electromagnetic wave detector array that can have improved sensitivity as compared to the electromagnetic wave detector described above.

DESCRIPTION OF EMBODIMENTS

Figure 1:
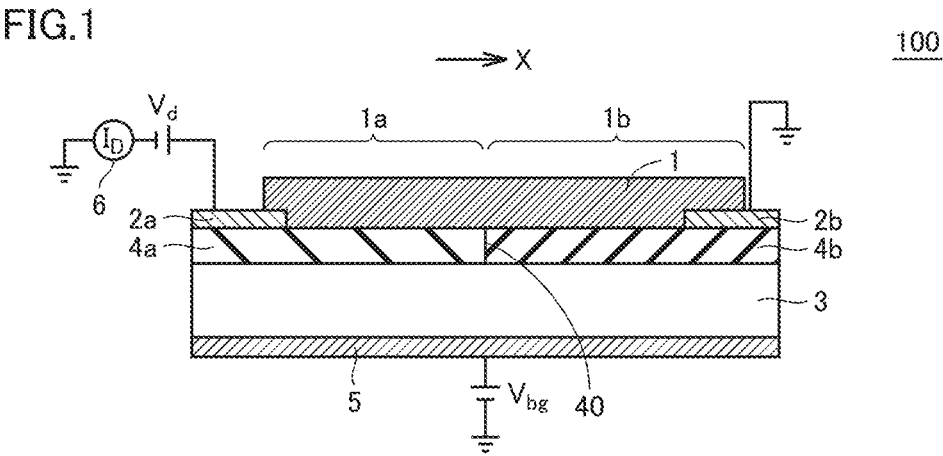
FIG. 1 is a cross-sectional view illustrating an electromagnetic wave detector according to a first embodiment.

Embodiments will be described hereinafter with reference to the drawings. In the following description, the same or corresponding components are denoted by the same reference characters, and the same description will not be repeated.

Figure 2:
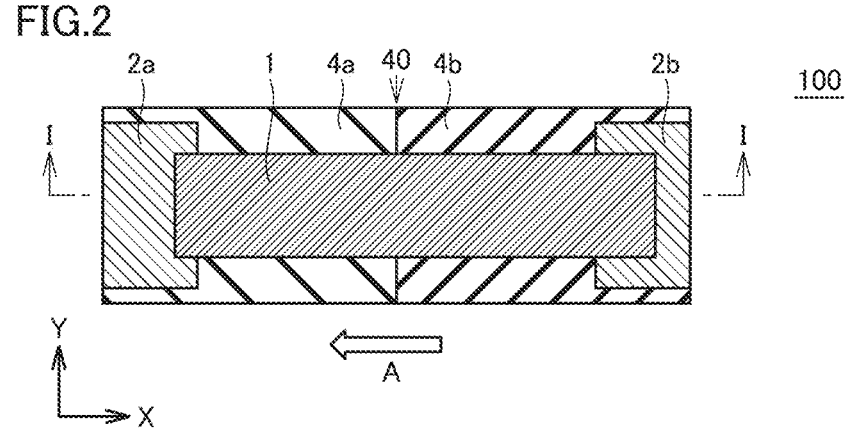
FIG. 2 is a plan view of the electromagnetic wave detector shown in FIG. 1.
Figure 20:
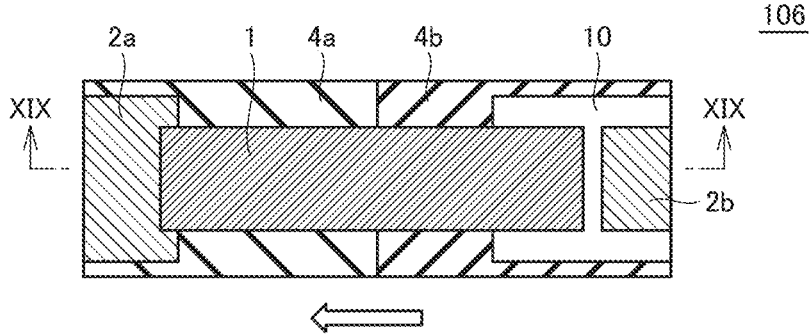
FIG. 20 is a plan view of the electromagnetic wave detector shown in FIG. 19.

In each of the embodiments described below, each figure is schematic and conceptually illustrates a function or structure. Further, although FIGS. 2 and 20 are plan views of electromagnetic wave detectors in the embodiments, each component shown in FIGS. 2 and 20 is hatched for the purpose of description. Further, the present disclosure is not limited by the embodiments described below. A basic configuration of an electromagnetic wave detector is the same among all the embodiments unless stated particularly. Further, the same or corresponding components are denoted by the same reference characters as described above. This applies to the entirety of the specification.

In each of the embodiments described below, a configuration of the electromagnetic wave detector when detecting visible light or infrared light will be described; however, the light detected by the electromagnetic wave detector of the present disclosure is not limited to the visible light or the infrared light. Each of the embodiments described below is effective as a detector to detect electric waves such as X-rays, ultraviolet light, near-infrared light, terahertz (THz) wave, and microwave in addition to the visible light and the infrared light. It should be noted that in each of the embodiments of the present disclosure, the light and electric waves will be collectively referred to as "electromagnetic wave".

Further, in the present embodiment, each of the terms "p type graphene" and "n type graphene" may be used as a graphene. In each of the embodiments described below, the p type graphene represents a graphene having a larger number of holes than those of a graphene in an intrinsic state, and the n type graphene represents a graphene having a larger number of electrons than those of the graphene in the intrinsic state. That is, an n type material is a material having an electron donating property. On the other hand, a p type material is a material having an electron attracting property.

Further, a material in which electrons are dominant when imbalance in charges is observed in a whole molecule may be referred to as n type. A material in which holes are dominant when imbalance in charges is observed in the whole molecule may be referred to as p type. One of an organic substance and an inorganic substance or a mixture of the organic substance and the inorganic substance may be used as a material of a member in contact with the graphene, which is an exemplary two-dimensional material layer.

Further, a plasmon resonance phenomenon such as a surface plasmon resonance phenomenon, which is an interaction between a metal surface and light, a phenomenon called pseudo surface plasmon resonance, which means resonance for a metal surface in a range other than a visible light range and a near-infrared light range, and a phenomenon called metamaterial or metasurface or plasmonic metamaterial, which means manipulation of a wavelength by a structure having a size equal to or less than a wavelength will not be particularly distinguished from one another by the names and will be handled in an equivalent manner in terms of effects exerted by the phenomena. Here, each of these resonances will be referred to as surface plasmon resonance, plasmon resonance, or, simply, resonance.

In each of the embodiments described below, the graphene is described as an exemplary material of the two-dimensional material layer; however, the material of the two-dimensional material layer is not limited to the graphene. For example, as the material of the two-dimensional material layer, each of the following materials can be applied: transition metal dichalcogenide (TMD), black phosphorus, silicene (two-dimensional honeycomb structure by silicon atoms), germanene (two-dimensional honeycomb structure by germanium atoms), and the like. Examples of the transition metal dichalcogenide include transition metal dichalcogenides such as molybdenum disulfide ($MoS_2$), tungsten disulfide ($WS_2$), and tungsten diselenide ($WSe_2$).

More preferably, the two-dimensional material layer may include any material selected from the group consisting of graphene, transition metal dichalcogenide (TMD), black phosphorus, silicene (two-dimensional honeycomb structure by silicon atoms), a graphene nanoribbon, and borophene, or may be formed by layering a plurality of layers of each of these materials.

Each of the materials such as transition metal dichalcogenide (TMD), black phosphorus, silicene (two-dimensional honeycomb structure by silicon atoms), a graphene nanoribbon, and borophene has a structure similar to graphene. In each of these materials, atoms are arranged in the form of a single layer in a two-dimensional plane. Therefore, also when each of these materials is applied to the two-dimensional material layer, the same functions and effects as those when the graphene is applied to the two-dimensional material layer can be obtained.

In the embodiments described below, an electromagnetic wave detector includes a first ferroelectric layer and a second ferroelectric layer. The material of each of the first ferroelectric layer and the second ferroelectric layer is a pyroelectric substance. The first ferroelectric layer and the second ferroelectric layer are defined as members with different voltage changes that occur due to a pyroelectric effect. For example, as will be described in the embodiments below, the first ferroelectric layer and the second ferroelectric layer can be defined as members made of materials different from each other. Alternatively, the first ferroelectric layer and the second ferroelectric layer can be defined as members having thicknesses different from each other.

First Embodiment

<Configuration of Electromagnetic Wave Detector 100>

Referring to FIGS. 1 to 2, a configuration of an electromagnetic wave detector 100 according to a first embodiment will be described.

As shown in FIG. 1, electromagnetic wave detector 100 includes a two-dimensional material layer 1, a first electrode portion 2a, a second electrode portion 2b, a substrate 3, a first ferroelectric layer 4a, a second ferroelectric layer 4b, and a third electrode portion 5.

Two-dimensional material layer 1 is electrically connected to each of first electrode portion 2a and second electrode portion 2b. Two-dimensional material layer 1 includes a first region 1a and a second region 1b disposed side by side in a first direction X. First region 1a is defined as a region within two-dimensional material layer 1 that is more strongly affected by a voltage change that occurs due to the pyroelectric effect in first ferroelectric layer 4a. Second region 1b is defined as a region within two-dimensional material layer 1 that is more strongly affected by a voltage change that occurs due to the pyroelectric effect in second ferroelectric layer 4b.

First electrode portion 2a and second electrode portion 2b are spaced from each other in first direction X, and are electrically connected to each other via first region 1a and second region 1b of two-dimensional material layer 1. First electrode portion 2a is electrically connected to first region 1a of two-dimensional material layer 1. Second electrode portion 2b is electrically connected to second region 1b of two-dimensional material layer 1.

Electromagnetic wave detector 100 is considered as a transistor with two-dimensional material layer 1 as a channel, first electrode portion 2a as a drain electrode, and second electrode portion 2b as a source electrode. This transistor structure using two-dimensional material layer 1 as a channel is hereinafter referred to as a transistor type.

A bias voltage Vd is applied between first electrode portion 2a and second electrode portion 2b (between the source and drain electrodes). A back gate voltage Vbg is applied to third electrode portion 5. A change in signal current is detected by a signal readout circuit such as an ammeter Id.

As shown in FIG. 1, first ferroelectric layer 4a is disposed side by side with second ferroelectric layer 4b in first direction X. A first end portion of first ferroelectric layer 4a located on the second region 1b side in first direction X is in contact with a second end portion of second ferroelectric layer 4b located on the first region 1a side in first direction X, for example.

As shown in FIGS. 1 and 2, first ferroelectric layer 4a has a portion overlapping with first region 1a of two-dimensional material layer 1 in a plan view. First ferroelectric layer 4a has a portion overlapping with first electrode portion 2a in the plan view, for example. First region 1a of two-dimensional material layer 1 and first electrode portion 2a are disposed on first ferroelectric layer 4a. First ferroelectric layer 4a has an upper surface in contact with a lower surface of first region 1a of two-dimensional material layer 1 and a lower surface of first electrode portion 2a, for example.

Second ferroelectric layer 4b has a portion overlapping with second region 1b of two-dimensional material layer 1 in the plan view. Second ferroelectric layer 4b has a portion overlapping with second electrode portion 2b in the plan view, for example. Second region 1b of two-dimensional material layer 1 and second electrode portion 2b are disposed on second ferroelectric layer 4b. Second ferroelectric layer 4b has an upper surface in contact with a lower surface of second region 1b of two-dimensional material layer 1, for example.

The material of each of first ferroelectric layer 4a and second ferroelectric layer 4b is a pyroelectric substance that produces the pyroelectric effect. The material of each of first ferroelectric layer 4a and second ferroelectric layer 4b may be a ferroelectric substance in which a change in polarization occurs in response to a change in thermal energy within the ferroelectric layer. In the pyroelectric effect, the electromagnetic wave simply acts as a heat source. Therefore, the pyroelectric effect basically has no wavelength dependency. Hence, each of first ferroelectric layer 4a and second ferroelectric layer 4b basically has no wavelength dependency. Therefore, each of first ferroelectric layer 4a and second ferroelectric layer 4b has sensitivity for electromagnetic waves in wide bands.

In the first embodiment, the material of first ferroelectric layer 4a is different from the material of second ferroelectric layer 4b. The material of first ferroelectric layer 4a has a polarizability different from that of the material of second ferroelectric layer 4b. For example, the material of first ferroelectric layer 4a has a polarizability higher than that of the material of second ferroelectric layer 4b. First ferroelectric layer 4a has a thickness equal to that of second ferroelectric layer 4b, for example.

As shown in FIG. 2, a boundary 40 between first ferroelectric layer 4a and second ferroelectric layer 4b is provided such that a potential difference (voltage gradient) occurs between first region 1a and second region 1b of two-dimensional material layer 1 due to a voltage change that occurs by the pyroelectric effect in each of first ferroelectric layer 4a and second ferroelectric layer 4b. More specifically, boundary 40 is positioned with respect to two-dimensional material layer 1 such that a voltage gradient occurs between first region 1a and second region 1b of two-dimensional material layer 1 due to a voltage change that occurs by the pyroelectric effect in each of first ferroelectric layer 4a and second ferroelectric layer 4b. In electromagnetic wave detector 100, boundary 40 is formed by an end face of the first end portion of first ferroelectric layer 4a located on the second region 1b side in first direction X, and an end face of the second end portion of second ferroelectric layer 4b located on the first region 1a side in first direction X. The end face of the first end portion is in contact with the end face of the second end portion.

As shown in FIG. 2, boundary 40 is formed in a region in which two-dimensional material layer 1 operates as a channel in the plan view. Boundary 40 extends in a direction intersecting first direction X. Boundary 40 extends along a second direction Y orthogonal to first direction X, for example. Boundary 40 is formed at the center of two-dimensional material layer 1 in first direction X, for example.

Boundary 40 can be arbitrarily formed as long as the voltage gradient can be formed between first region 1a and second region 1b. Boundary 40 may be formed at least in the channel region in the plan view. Boundary 40 may be formed on the first electrode portion 2a side or on the second electrode portion 2b side with respect to the center of two-dimensional material layer 1 in first direction X in the plan view. Boundary 40 may be provided to form an angle of less than 90° with respect to first direction X in which a current flows. In this case too, charge extraction efficiency is improved due to a photobiasing effect, leading to improved sensitivity of electromagnetic wave detector 100.

As shown in FIG. 2, first ferroelectric layer 4a is formed to overlap with entire first region 1a of two-dimensional material layer 1 in the plan view, for example. Second ferroelectric layer 4b is formed to overlap with entire second region 1b of two-dimensional material layer 1 in the plan view, for example. Each of first ferroelectric layer 4a and second ferroelectric layer 4b is also formed in a region not overlapping with two-dimensional material layer 1 in the plan view, for example.

Each of first ferroelectric layer 4a and second ferroelectric layer 4b may not include a region not overlapping with two-dimensional material layer 1 in the plan view. In other words, entire first ferroelectric layer 4a and second ferroelectric layer 4b may be formed to overlap with two-dimensional material layer 1 in the plan view. Each of first ferroelectric layer 4a and second ferroelectric layer 4b may be formed to overlap with only a portion of two-dimensional material layer 1 in the plan view. First ferroelectric layer 4a may be formed to overlap with only a portion of first region 1a of two-dimensional material layer 1 in the plan view. Second ferroelectric layer 4b may be formed to overlap with only a portion of second region 1b of two-dimensional material layer 1 in the plan view.

That is, the positional relationship of two-dimensional material layer 1 and each of first ferroelectric layer 4a and second ferroelectric layer 4b relative to each other can be arbitrarily selected as long as the position of boundary 40 relative to two-dimensional material layer 1 is set such that a voltage gradient occurs between first region 1a and second region 1b due to a voltage change that occurs by the pyroelectric effect in each of first ferroelectric layer 4a and second ferroelectric layer 4b.

First ferroelectric layer 4a and second ferroelectric layer 4b are disposed on substrate 3. Substrate 3 has a first surface and a second surface located opposite to the first surface. Substrate 3 is a flat semiconductor substrate including silicon (Si) or the like, for example. The material of substrate 3 is not particularly limited as long as the structure on the first surface can be maintained. Two-dimensional material layer 1, first electrode portion 2a, first ferroelectric layer 4a, and second ferroelectric layer 4b are disposed on the first surface. Third electrode portion 5 is disposed on the second surface. Third electrode portion 5 is a so-called back gate electrode.

Next, configurations of two-dimensional material layer 1, first electrode portion 2a, second electrode portion 2b, first ferroelectric layer 4a, and second ferroelectric layer 4b will be described in detail.

<Configuration of Two-Dimensional Material Layer 1>

Two-dimensional material layer 1 is monolayer graphene, for example. The monolayer graphene is a monoatomic layer of two-dimensional carbon crystal. Graphene has a plurality of carbon atoms located in each of a plurality of chains arranged in a hexagonal shape. Graphene has a low absorptivity of 2.3% for white light. In the present embodiment, white light refers to light in which light beams having wavelengths of visible light are equally mixed.

Two-dimensional material layer 1 may be multilayer graphene having a plurality of stacked graphene layers. The orientations of lattice vectors of hexagonal lattices of graphene in the multilayer graphene may or may not be matched. The orientations of lattice vectors of hexagonal lattices of graphene in the multilayer graphene may be completely matched. Two-dimensional material layer 1 may be graphene doped with a p type or n type impurity. When two-dimensional material layer 1 is multilayer graphene, the stacking structure of the multilayer graphene may be so-called AB stacking, or turbostratic stacking in which graphene layers are stacked in the state that the respective lattices of the graphene layers are mismatched. The turbostratic stacking is also referred to as random stacking (turbostratic graphene).

When two-dimensional material layer 1 is multilayer graphene, a band gap is formed in two-dimensional material layer 1. That is, the size of the band gap can be adjusted by changing the number of stacked graphene layers. This can allow two-dimensional material layer 1 to have a wavelength selection effect of selecting an electromagnetic wave to be photoelectrically converted (hereinafter referred to simply as a detection wavelength). For example, an increased number of graphene layers in the multilayer graphene decreases the mobility in the channel region. On the other hand, an increased number of graphene layers in the multilayer graphene suppresses the effect of photocarrier scattering from the substrate, leading to reduced noise of electromagnetic wave detector 100. In electromagnetic wave detector 100 having two-dimensional material layer 1 using the multilayer graphene, therefore, an increased amount of light is absorbed, leading to improved detection sensitivity for electromagnetic waves.

As described above, nanoribbon-like graphene (graphene nanoribbon) may be used as two-dimensional material layer 1. Two-dimensional material layer 1 may have a graphene nanoribbon alone. Two-dimensional material layer 1 may have a plurality of stacked graphene nanoribbons. Two-dimensional material layer 1 may have a structure in which graphene nanoribbons are periodically arranged on a plane. When two-dimensional material layer 1 includes a plurality of periodically arranged graphene nanoribbons, plasmon resonance occurs in the graphene nanoribbons, leading to improved sensitivity of electromagnetic wave detector 100. Further, although the area of effective current flow decreases, the amount of light illumination remains unchanged due to the effect of the plasmon resonance, so that dark current can be reduced.

The structure in which graphene nanoribbons are periodically arranged is sometimes referred to as a graphene metamaterial or graphene metasurface. That is, the effect described above is obtained in electromagnetic wave detector 100 using the graphene metamaterial as two-dimensional material layer 1.

Since first region 1a of two-dimensional material layer 1 is in contact with first electrode portion 2a, two-dimensional material layer 1 is doped with photocarriers from first electrode portion 2a. For example, when two-dimensional material layer 1 is graphene and first electrode portion 2a is gold (Au), the photocarriers are holes. Second region 1b in contact with first electrode portion 2a is doped with holes due to the difference in work function between graphene and gold (Au). If electromagnetic wave detector 100 is driven in an electron conduction state after second region 1b has been doped with holes, the mobility of electrons flowing through the channel decreases due to the effect of the holes. This results in increased contact resistance between two-dimensional material layer 1 and first electrode portion 2a. In particular, when all regions of two-dimensional material layer 1 are formed of monolayer graphene, a large amount (doping amount) of photocarriers is injected into two-dimensional material layer 1 from first electrode portion 2a. This results in notable decrease in the mobility of electric field effect in electromagnetic wave detector 100. Therefore, when all regions of two-dimensional material layer 1 are formed of monolayer graphene, the performance of electromagnetic wave detector 100 decreases.

The amount of photocarriers with which multilayer graphene is doped from first electrode portion 2a when a region of two-dimensional material layer 1 that is in contact with first electrode portion 2a is formed of this multilayer graphene is lower than the amount of photocarriers with which monolayer graphene is doped from first electrode portion 2a when the region of two-dimensional material layer 1 that is in contact with first electrode portion 2a is formed of this monolayer graphene. Thus, when the region of two-dimensional material layer 1 that is doped with photocarriers from first electrode portion 2a is formed of multilayer graphene, increase in the contact resistance between two-dimensional material layer 1 and first electrode portion 2a can be suppressed. This can suppress the decrease in the mobility of electric field effect in electromagnetic wave detector 100, leading to improved performance of electromagnetic wave detector 100.

An end portion of two-dimensional material layer 1 may be graphene nanoribbon. In this case, since graphene nanoribbon has a bandgap, a Schottky junction is formed in a junction region between the graphene nanoribbon and a semiconductor portion.

<Configurations of First Electrode Portion 2a and Second Electrode Portion 2b>

The material of each of first electrode portion 2a and second electrode portion 2b may be any material as long as it is a conductor. The material of each of first electrode portion 2a and second electrode portion 2b may include, for example, at least one of gold (Au), silver (Ag), copper (Cu), aluminum (Al), nickel (Ni), chromium (Cr), and palladium (Pd).

First region 1a of two-dimensional material layer 1 has a thickness equal to that of second region 1b of two-dimensional material layer 1, for example.

<Configurations of First Ferroelectric Layer 4a and Second Ferroelectric Layer 4b>

The material of each of first ferroelectric layer 4a and second ferroelectric layer 4b can be arbitrarily selected as long as polarization occurs in each of first ferroelectric layer 4a and second ferroelectric layer 4b when the electromagnetic wave having the detection wavelength enters each of first ferroelectric layer 4a and second ferroelectric layer 4b. The material of each of first ferroelectric layer 4a and second ferroelectric layer 4b includes, for example, at least one selected from the group consisting of barium titanate (BaTiO$_3$), lithium niobate (LiNbO$_3$), lithium tantalate (LiTaO$_3$), strontium titanate (SrTiO$_3$), lead zirconate titanate (PZT), strontium bismuth tantalate (SBT), bismuth ferrite (BFO), zinc oxide (ZnO), hafnium oxide (HfO$_2$), and a polyvinylidene-fluoride-based ferroelectric material (PVDF, P(VDF-TrFE), P(VDF-TrFE-CTFE)), which is an organic polymer. Further, each of first ferroelectric layer 4a and second ferroelectric layer 4b may be formed by laminating or mixing a plurality of different ferroelectric materials. The material of first ferroelectric layer 4a is LiNbO$_3$, for example. The material of second ferroelectric layer 4b is LiTaO$_3$, for example.

The material of each of first ferroelectric layer 4a and second ferroelectric layer 4b may be a material having spontaneous polarization. In this case, each of first ferroelectric layer 4a and second ferroelectric layer 4b increases in temperature when irradiated with an electromagnetic wave, resulting in decrease in the spontaneous polarization.

Preferably, first ferroelectric layer 4a and second ferroelectric layer 4b are configured such that a speed of change in dielectric polarization in each of first ferroelectric layer 4a and second ferroelectric layer 4b is as fast as possible. Preferably, each of first ferroelectric layer 4a and second ferroelectric layer 4b has a thickness (film thickness) as thin as possible to the extent that a voltage can be applied to two-dimensional material layer 1.

Preferably, the thickness of each of first ferroelectric layer 4a and second ferroelectric layer 4b is set such that the largest possible voltage is applied to two-dimensional material layer 1 when two-dimensional material layer 1 is irradiated with an electromagnetic wave. The polarization direction of each of first ferroelectric layer 4a and second ferroelectric layer 4b is not particularly limited, but is desirably the direction in which a voltage is applied between first electrode portion 2a and second electrode portion 2b, that is, the direction in which the bias voltage is applied, in two-dimensional material layer 1.

<Method for Manufacturing Electromagnetic Wave Detector 100>

Next, a method for manufacturing electromagnetic wave detector 100 according to the first embodiment will be described. The method for manufacturing electromagnetic wave detector 100 shown in FIG. 1 includes a preparing step, a ferroelectric layer forming step, an electrode portion forming step, and a two-dimensional material layer forming step.

First, the preparing step is performed. In the preparing step, substrate 3 shown in FIG. 1 is prepared. Substrate 3 is a flat semiconductor substrate including silicon (Si) or the like, for example.

Next, the ferroelectric layer forming step is performed. In the ferroelectric layer forming step, first ferroelectric layer 4a is initially formed on the first surface of substrate 3, and second ferroelectric layer 4b is then formed on the first surface.

A method for forming the first ferroelectric layer and the second ferroelectric layer is not particularly limited. When the material of each of first ferroelectric layer 4a and second ferroelectric layer 4b is a polymer-based material, for example, each of first ferroelectric layer 4a and second ferroelectric layer 4b can be sequentially formed by film formation with a spin coating method or the like, and then patterning with a photolithography method.

When the material of each of first ferroelectric layer 4a and second ferroelectric layer 4b is different from a polymer-based material, each of first ferroelectric layer 4a and second ferroelectric layer 4b can be sequentially formed by film formation with sputtering, vapor deposition, a metal organic decomposition method (metal organic decomposition (MOD) coating method), or an atomic layer deposition (ALD) method, and then patterning with a photolithography method. Each of first ferroelectric layer 4a and second ferroelectric layer 4b may be patterned by a lift-off method.

The method described above forms and patterns first ferroelectric layer 4a, and then forms and patterns second ferroelectric layer 4b. Alternatively, first ferroelectric layer 4a may be formed in planar form, followed by formation of second ferroelectric layer 4b and patterning of only second ferroelectric layer 4b.

Next, the electrode portion forming step is performed. In this step, first electrode portion 2a is formed on first ferroelectric layer 4a, and second electrode portion 2b is further formed on second ferroelectric layer 4b.

The following process is used, for example, as a method for forming first electrode portion 2a and second electrode portion 2b. First, a resist mask is formed on first ferroelectric layer 4a and second ferroelectric layer 4b by photolithography, electron beam (EB) lithography, or the like. The resist mask is provided with an opening in a region where each of first and second electrode portions 2a and 2b is to be formed. Then, a film of metal or the like to be each of first electrode portion 2a and second electrode portion 2b is formed on the resist mask. The film is formed using a vapor deposition method, a sputtering method or the like. At this time, the film is formed to extend from inside the opening area of the resist mask to the upper surface of the resist mask. The resist mask is then removed together with a portion of the film. The other portions of the film in the opening area of the resist mask remain on first ferroelectric layer 4a and second ferroelectric layer 4b, and serve as first electrode portion 2a and second electrode portion 2b. The method described above is generally called lift-off.

Another method may be used for forming first electrode portion 2a and second electrode portion 2b. For example, a conductive film to be first electrode portion 2a and a conductive film to be second electrode portion 2b are initially formed. A resist mask is then formed on each of the conductive films by a photolithography method. The resist mask is formed to cover a region in which each of first electrode portion 2a and second electrode portion 2b is to be formed, and to expose the other regions. The conductive film is then partially removed by wet etching or dry etching using the resist mask as a mask. As a result, a portion of the conductive film remains under the resist mask. This portion of the conductive film serves as first electrode portion 2a or second electrode portion 2b. The resist mask is then removed. First electrode portion 2a and second electrode portion 2b may be formed in this manner.

Next, the two-dimensional material layer forming step is performed. In this step, two-dimensional material layer 1 is formed on at least a portion of each of first electrode portion 2a, second electrode portion 2b, first ferroelectric layer 4a, and second ferroelectric layer 4b. Two-dimensional material layer 1 is formed to cover at least a portion of each of first electrode portion 2a, second electrode portion 2b, first ferroelectric layer 4a, and second ferroelectric layer 4b, for example. A method for forming two-dimensional material layer 1 is not particularly limited. Two-dimensional material layer 1 may be formed by epitaxial growth, or by a screen printing method, for example. Two-dimensional material layer 1 may be formed by transferring and attaching a two-dimensional material film formed in advance by a CVD method. Two-dimensional material layer 1 may be formed by transferring and attaching a two-dimensional material film peeled off by mechanical peeling or the like.

After two-dimensional material layer 1 is formed, a resist mask is formed on two-dimensional material layer 1 by a photolithography method. The resist mask is formed to cover a region in which two-dimensional material layer 1 is to be formed, and to expose the other regions. Two-dimensional material layer 1 is then etched using the resist mask as an etching mask. A method for the etching is dry etching with oxygen plasma, for example. The resist mask is then removed. Two-dimensional material layer 1 shown in FIG. 1 is thus formed.

Electromagnetic wave detector 100 is manufactured through the steps described above.

Although two-dimensional material layer 1 is formed on first electrode portion 2a and second electrode portion 2b in the manufacturing method described above, two-dimensional material layer 1 may be formed on first ferroelectric layer 4a and second ferroelectric layer 4b, and then first electrode portion 2a and second electrode portion 2b may be formed to overlap with a portion of this two-dimensional material layer 1. Care must be taken, however, to avoid damage to two-dimensional material layer 1 by the process of forming first electrode portion 2a and second electrode portion 2b during the formation of first electrode portion 2a and second electrode portion 2b. The damage by the process of forming first electrode portion 2a and second electrode portion 2b is suppressed, for example, by forming first electrode portion 2a and second electrode portion 2b after a protective film or the like covers a region of two-dimensional material layer 1 other than the region with which first electrode portion 2a is to overlap. Even if there is a step between first ferroelectric layer 4a and second ferroelectric layer 4b, two-dimensional material layer 1 can be formed without any essential change to the manufacturing steps.

<Principle of Operation of Electromagnetic Wave Detector 100>

Next, the principle of operation of electromagnetic wave detector 100 according to the first embodiment will be described with reference to FIG. 1.

As shown in FIG. 1, first, a signal readout circuit is electrically connected between first electrode portion 2a and second electrode portion 2*b*. FIG. 1 shows only ammeter Id as the readout circuit. First electrode portion 2*a*, two-dimensional material layer 1, and second electrode portion 2*b* are electrically connected sequentially.

The bias voltage (Vbg) need not be applied to two-dimensional material layer 1. When the bias voltage is not applied to two-dimensional material layer 1, dark current is zero since no voltage is applied. That is, electromagnetic wave detector 100 is turned off.

Next, each of first ferroelectric layer 4*a* and second ferroelectric layer 4*b* is irradiated with an electromagnetic wave. A change in dielectric polarization occurs in each of first ferroelectric layer 4*a* and second ferroelectric layer 4*b* due to the pyroelectric effect of first ferroelectric layer 4*a* and second ferroelectric layer 4*b*.

At this time, a voltage change that occurs in first ferroelectric layer 4*a* is different from a voltage change that occurs in second ferroelectric layer 4*b*, and therefore, different voltages are applied to first region 1*a* and second region 1*b* of two-dimensional material layer 1. That is, a bias voltage similar to a PN junction is applied in a pseudo manner within two-dimensional material layer 1 in electromagnetic wave detector 100. The charge extraction efficiency is thus improved, leading to increased sensitivity. This phenomenon is referred to as a photobiasing effect. As a result, the voltage of a current or the current flowing through two-dimensional material layer 1 when irradiated with an electromagnetic wave is measured by the ammeter. The electromagnetic wave is detected using electromagnetic wave detector 100 in this manner.

The photobiasing effect described above can also be interpreted as described below. When each of first ferroelectric layer 4*a* and second ferroelectric layer 4*b* is irradiated with an electromagnetic wave, the dielectric polarization of each of first ferroelectric layer 4*a* and second ferroelectric layer 4*b* changes due to the pyroelectric effect, causing the Fermi level of two-dimensional material layer 1 to be modulated to a different Fermi level in each of first region 1*a* and second region 1*b* of two-dimensional material layer 1. Due to the different Fermi levels between first region 1*a* and second region 1*b*, a current flows only when electromagnetic wave detector 100 is irradiated with an electromagnetic wave. Thus, a current can be detected only when electromagnetic wave detector 100 is irradiated with an electromagnetic wave.

Electromagnetic wave detector 100 is not limited to the configuration in which a current change is detected as described above. For example, a voltage change between first electrode portion 2*a* and second electrode portion 2*b* may be detected when electromagnetic wave detector 100 is irradiated with an electromagnetic wave, with a constant current passed between first electrode portion 2*a* and second electrode portion 2*b*. The voltage change between first electrode portion 2*a* and second electrode portion 2*b* when electromagnetic wave detector 100 is irradiated with an electromagnetic wave is a voltage change in two-dimensional material layer 1.

Electromagnetic wave detector 100 described above may be disposed as a first electromagnetic wave detector, and a second electromagnetic wave detector having the same configuration as the first electromagnetic wave detector may be further disposed. The first electromagnetic wave detector is disposed in a space irradiated with the electromagnetic wave. The second electromagnetic wave detector is disposed in a space shielded from the electromagnetic wave. The electromagnetic wave may be detected by detecting the difference between a current of the first electromagnetic wave detector and a current of the second electromagnetic wave detector. The electromagnetic wave may be detected by detecting the difference between a voltage of the first electromagnetic wave detector and a voltage of the second electromagnetic wave detector.

<Operation of Electromagnetic Wave Detector 100>

Next, the specific operation of electromagnetic wave detector 100 according to the first embodiment will be described with reference to FIG. 1. In the following description, graphene is used as the material of two-dimensional material layer 1, lithium niobate ($LiNbO_3$) is used as the material of first ferroelectric layer 4*a*, and lithium tantalate ($LiTaO_3$) is used as the material of second ferroelectric layer 4*b*.

The detection wavelength of electromagnetic wave detector 100 is determined by the absorption wavelength of lithium niobate ($LiNbO_3$).

When the electromagnetic wave having the detection wavelength enters each of first ferroelectric layer 4*a* and second ferroelectric layer 4*b*, a change in dielectric polarization occurs in each of first ferroelectric layer 4*a* and second ferroelectric layer 4*b* due to the pyroelectric effect. The change in polarization in each of first ferroelectric layer 4*a* and second ferroelectric layer 4*b* causes a change in voltage in electromagnetic wave detector 100.

Since the graphene forming two-dimensional material layer 1 has high mobility of photocarriers, a large displacement current is obtained in response to a slight voltage change. Therefore, the Fermi level of two-dimensional material layer 1 significantly changes due to the pyroelectric effect of each of first ferroelectric layer 4*a* and second ferroelectric layer 4*b*. A large voltage change or current change occurs between first electrode portion 2*a* and second electrode portion 2*b*.

In addition, since the material of first ferroelectric layer 4*a* is $LiNbO_3$ and the material of second ferroelectric layer 4*b* is $LiTaO_3$, the changes in dielectric polarization that occur in these layers are different. Thus, the amount of voltage change that occurs in first region 1*a* is different from the amount of voltage change that occurs in second region 1*b*. Accordingly, a bias similar to a PN junction is generated in a pseudo manner in the graphene forming two-dimensional material layer 1. As a result, the current flowing through two-dimensional material layer 1 and the voltage applied to two-dimensional material layer 1 in electromagnetic wave detector 100 are increased, as compared to when each of first ferroelectric layer 4*a* and second ferroelectric layer 4*b* is not formed and only one ferroelectric layer is formed to overlap with two-dimensional material layer 1 in the plan view.

Based on the foregoing, a voltage change or current change occurs between first electrode portion 2*a* and second electrode portion 2*b* in electromagnetic wave detector 100, due to the pyroelectric effect of each of first ferroelectric layer 4*a* and second ferroelectric layer 4*b*.

Further, when the speed of change in dielectric polarization in each of first ferroelectric layer 4*a* and second ferroelectric layer 4*b* is set to be as short as possible, the time between the entry of the electromagnetic wave into electromagnetic wave detector 100 and the occurrence of the change in resistance in two-dimensional material layer 1 decreases. This leads to increased response speed of electromagnetic wave detector 100 using the photobiasing effect.

The configuration of electromagnetic wave detector 100 according to the present embodiment can be applied to other embodiments as well.

<Functions and Effects>

Next, functions and effects of the present embodiment will be described.

The amount current change in two-dimensional material layer 1 resulting from the polarization in each of first ferroelectric layer 4a and second ferroelectric layer 4b due to the pyroelectric effect is larger than the amount of current change in an ordinary semiconductor. In particular, a small voltage change leads to a large current change in two-dimensional material layer 1, as compared to an ordinary semiconductor.

For example, when monolayer graphene is used as two-dimensional material layer 1, two-dimensional material layer 1 has a thickness corresponding to the thickness of one atomic layer and is therefore very thin. That is, two-dimensional material layer 1 is more strongly affected by a voltage change in its surroundings than a channel made of an ordinary bulk material. Further, monolayer graphene has an electron mobility higher than that of an ordinary bulk material. In this case, the amount of current change in two-dimensional material layer 1 as calculated from the electron mobility in two-dimensional material layer 1 and the thickness thereof is about several hundred times to several thousand times larger than the amount of current change in an ordinary semiconductor. This effect is referred to as a photogating effect.

The amount of change in detection current in two-dimensional material layer 1 is significantly improved due to the photogating effect. The photogating effect does not directly increase the quantum efficiency of a photoelectric conversion material as in an ordinary semiconductor, but increases the amount of current change due to the entry of an electromagnetic wave. Therefore, the quantum efficiency of electromagnetic wave detector 100 as calculated from a differential current due to the entry of an electromagnetic wave can exceed 100%. Thus, electromagnetic wave detector 100 according to the present embodiment has an electromagnetic wave detection sensitivity higher than that of a semiconductor electromagnetic wave detector or a graphene electromagnetic wave detector to which the photogating effect is not applied.

When the material of first ferroelectric layer 4a is LiNbO$_3$ and the material of second ferroelectric layer 4b is LiTaO$_3$, a change in dielectric polarization that occurs in first ferroelectric layer 4a is different from a change in dielectric polarization that occurs in second ferroelectric layer 4b, and therefore, a voltage change that occurs in first region 1a is different from a voltage change that occurs in second region 1b. Accordingly, a bias similar to a PN junction is generated in a pseudo manner in the graphene forming two-dimensional material layer 1. Therefore, the current flowing through two-dimensional material layer 1 and the voltage applied to two-dimensional material layer 1 in electromagnetic wave detector 100 are increased, as compared to when each of first ferroelectric layer 4a and second ferroelectric layer 4b is not formed and only one ferroelectric layer is formed to overlap with two-dimensional material layer 1 in the plan view.

The amount of current change when electromagnetic wave detector 100 is irradiated with an electromagnetic wave includes a change by a photoelectric current generated by the photoelectric conversion in two-dimensional material layer 1. Therefore, the photobiasing effect, the photogating effect and the photoelectric conversion described above occur by the irradiation of electromagnetic wave detector 100 with an electromagnetic wave. Thus, electromagnetic wave detector 100 can detect a current change due to the photobiasing effect, the photogating effect and the photoelectric conversion. Therefore, electromagnetic wave detector 100 has improved sensitivity.

The material of two-dimensional material layer 1 includes one selected from the group consisting of graphene, transition metal dichalcogenide, black phosphorus, silicene, graphene nanoribbon, and borophene. Accordingly, the functions and effects of the present embodiment can be reliably obtained.

<First Modification>

Electromagnetic wave detector 100 can be modified as described below.

Electromagnetic wave detector 100 may further include one or more ferroelectric layers in addition to first ferroelectric layer 4a and second ferroelectric layer 4b.

Figure 3:
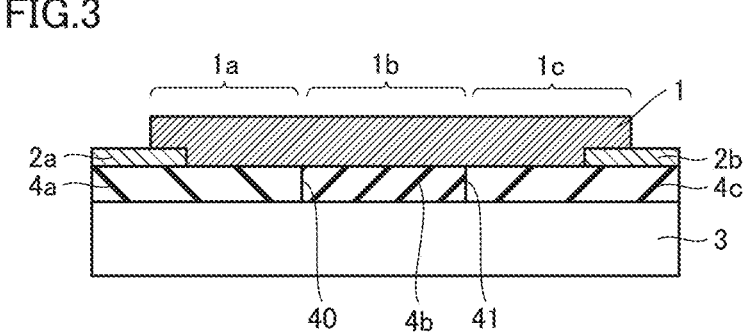
FIG. 3 is a cross-sectional view illustrating a modification of the electromagnetic wave detector according to the first embodiment.

As shown in FIG. 3, electromagnetic wave detector 100 may further include a third ferroelectric layer 4c. Third ferroelectric layer 4c is disposed opposite to first ferroelectric layer 4a with respect to second ferroelectric layer 4b in first direction X. First ferroelectric layer 4a, second ferroelectric layer 4b, and third ferroelectric layer 4c are disposed side by side in this order in first direction X.

Two-dimensional material layer 1 shown in FIG. 3 includes first region 1a, second region 1b, and a third region 1c disposed side by side in first direction X. Third region 1c is defined as a region within two-dimensional material layer 1 that is more strongly affected by a voltage change that occurs due to the pyroelectric effect in third ferroelectric layer 4c. Second electrode portion 2b is disposed on third ferroelectric layer 4c, and is in contact with third region 1c. Thus, first electrode portion 2a, first region 1a, second region 1b, and third region 1c of two-dimensional material layer 1, and second electrode portion 2b are electrically connected in this order.

The material of third ferroelectric layer 4c is different from the material of first ferroelectric layer 4a and the material of second ferroelectric layer 4b. The material of third ferroelectric layer 4c has a polarizability different from that of the material of first ferroelectric layer 4a and the material of second ferroelectric layer 4b. The material of third ferroelectric layer 4c has a polarizability lower than that of the material of second ferroelectric layer 4b, for example. In other words, the polarizabilities of the materials of first ferroelectric layer 4a, second ferroelectric layer 4b, and third ferroelectric layer 4c become lower in this order.

A boundary 41 between second ferroelectric layer 4b and third ferroelectric layer 4c is provided such that a potential difference (voltage gradient) occurs between second region 1b and third region 1c of two-dimensional material layer 1 due to a voltage change that occurs by the pyroelectric effect in each of second ferroelectric layer 4b and third ferroelectric layer 4c. More specifically, boundary 41 is positioned with respect to two-dimensional material layer 1 such that a voltage gradient occurs between second region 1b and third region 1c of two-dimensional material layer 1 due to a voltage change that occurs by the pyroelectric effect in each of second ferroelectric layer 4b and third ferroelectric layer 4c.

Boundary 41 is formed in the region in which two-dimensional material layer 1 operates as a channel in the plan view. Boundary 41 extends in the direction intersecting first direction X. Boundary 41 extends along second direction Y orthogonal to first direction X, for example. Boundary 41 extends parallel to boundary 40, for example.

Boundary 41 can be arbitrarily formed as long as the voltage gradient can be formed between second region 1b and third region 1c. Boundary 41 may be formed at least in the channel region in the plan view. Boundary 41 may be provided to form an angle of less than 90° with respect to first direction X in which a current flows.

Electromagnetic wave detector 100 may further include a plurality of ferroelectric layers in addition to first ferroelectric layer 4a and second ferroelectric layer 4b. First ferroelectric layer 4a, second ferroelectric layer 4b and the other plurality of ferroelectric layers are disposed side by side in first direction X such that their polarizabilities become lower from the first electrode portion 2a side to the second electrode portion 2b side in first direction X, for example.

First electrode portion 2a and second electrode portion 2b may be formed above two-dimensional material layer 1. The positional relationship of two-dimensional material layer 1 and each of first electrode portion 2a and second electrode portion 2b relative to each other can be arbitrarily selected as long as two-dimensional material layer 1 is electrically connected to each of first electrode portion 2a and second electrode portion 2b. For example, two-dimensional material layer 1 may be connected to each of first electrode portion 2a and second electrode portion 2b by so-called edge contact. Two-dimensional material layer 1 may have an end face in contact with an end face of each of first electrode portion 2a and second electrode portion 2b. In this case, the contact resistance between two-dimensional material layer 1 and each of first electrode portion 2a and second electrode portion 2b decreases, leading to improved characteristics of electromagnetic wave detector 100.

Further, two-dimensional material layer 1 may be provided with at least one pore or a plurality of periodically arranged pores, at a contact surface between two-dimensional material layer 1 and each of first electrode portion 2a and second electrode portion 2b. The pore is a nanopore having a pore diameter on the order of nanometers, for example. By forming the pore in two-dimensional material layer 1 in this manner, the contact resistance decreases, leading to improved characteristics of electromagnetic wave detector 100.

Electromagnetic wave detector 100 may not include substrate 3. Substrate 3 is not essential when first ferroelectric layer 4a and second ferroelectric layer 4b can maintain the structure including two-dimensional material layer 1, first electrode portion 2a, second electrode portion 2b, first ferroelectric layer 4a, second ferroelectric layer 4b, and third electrode portion 5.

Electromagnetic wave detector 100 may not include third electrode portion 5. In other words, substrate 3 may act as a back gate electrode.

A protective film (not shown) may be provided on first ferroelectric layer 4a and second ferroelectric layer 4b. The protective film (not shown) may be provided to cover two-dimensional material layer 1, first electrode portion 2a, and second electrode portion 2b. Examples of the material of the protective film include an insulator such as an oxide or a nitride. Examples of the material of the protective film include silicon oxide (SiO$_2$), silicon nitride (SiN), hafnium oxide (HfO$_2$), aluminum oxide (Al$_2$O$_3$), and boron nitride (BN).

Electromagnetic wave detector 100 may further include a Mott insulator (not shown). The Mott insulator (not shown) is configured such that its physical properties such as temperature change due to photoinduced phase transition caused by light illumination. The Mott insulator (not shown) is in contact with each of first ferroelectric layer 4a and second ferroelectric layer 4b.

Second Embodiment

Figure 4:
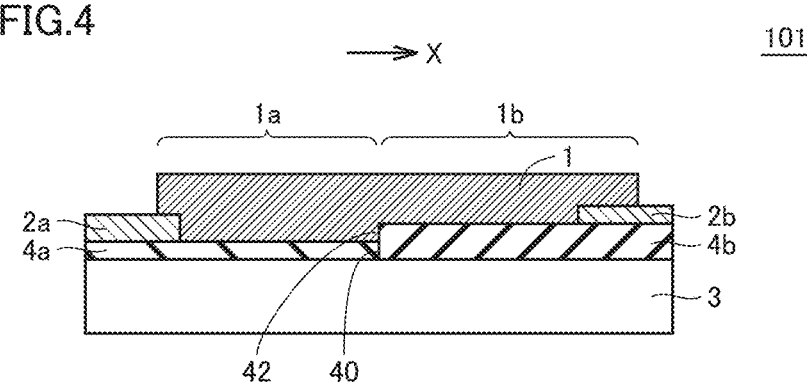
FIG. 4 is a cross-sectional view illustrating an electromagnetic wave detector according to a second embodiment.

As shown in FIG. 4, an electromagnetic wave detector 101 according to a second embodiment has basically the same configuration and the same effect as those of electromagnetic wave detector 100 according to the first embodiment, but is different from electromagnetic wave detector 100 in that first ferroelectric layer 4a has a thickness different from that of second ferroelectric layer 4b. The difference of electromagnetic wave detector 101 from electromagnetic wave detector 100 will be mainly described.

First ferroelectric layer 4a has a thickness smaller than that of second ferroelectric layer 4b, for example. A stepped portion 42 is formed on boundary 40 between first ferroelectric layer 4a and second ferroelectric layer 4b. Two-dimensional material layer 1 is disposed to cover stepped portion 42. In electromagnetic wave detector 101, too, the amount of voltage change that occurs due to the pyroelectric effect in first ferroelectric layer 4a is different from the amount of voltage change that occurs due to the pyroelectric effect in second ferroelectric layer 4b. Thus, in electromagnetic wave detector 101, too, the photogating effect is produced and improved sensitivity is achieved, as in electromagnetic wave detector 100.

The material of first ferroelectric layer 4a is different from the material of second ferroelectric layer 4b, for example. The material of first ferroelectric layer 4a has a polarizability different from that of the material of second ferroelectric layer 4b, for example. For example, the material of first ferroelectric layer 4a has a polarizability higher than that of the material of second ferroelectric layer 4b.

First region 1a of two-dimensional material layer 1 has a thickness equal to that of second region 1b of two-dimensional material layer 1. Although the upper surface of two-dimensional material layer 1 is illustrated as being flat in the drawings for the purpose of illustration, the upper surface of two-dimensional material layer 1 is stepped as with the lower surface of two-dimensional material layer 1, for example. The upper surface of second region 1b is located above the upper surface of first region 1a, for example. However, first region 1a of two-dimensional material layer 1 may have a thickness different from that of second region 1b of two-dimensional material layer 1. The upper surface of second region 1b may be provided to be flush with the upper surface of first region 1a, for example.

Electromagnetic wave detector 101 can be manufactured by basically the same method as that for manufacturing electromagnetic wave detector 100.

<Second Modification>

Electromagnetic wave detector 101 can be modified as described below.

Figure 5:
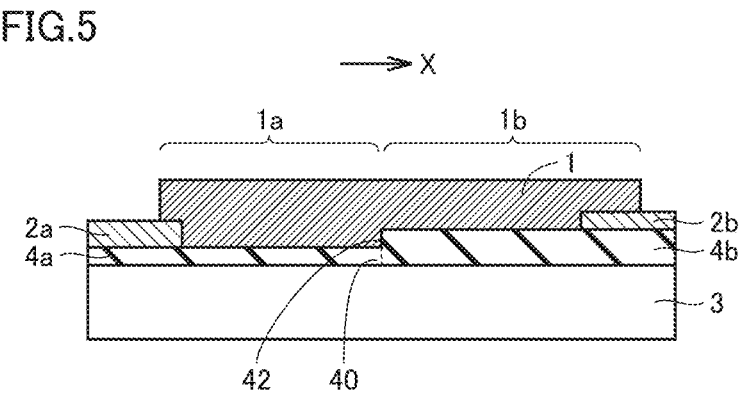
FIG. 5 is a cross-sectional view illustrating a first modification of the electromagnetic wave detector according to the second embodiment.

As shown in FIG. 5, the material of first ferroelectric layer 4a may be the same as the material of second ferroelectric layer 4b. The material of first ferroelectric layer 4a may have a polarizability equal to that of the material of second ferroelectric layer 4b. That is, in electromagnetic wave detector 101, the only difference between first ferroelectric layer 4a and second ferroelectric layer 4b may be their thicknesses. In this case too, the photogating effect described above is produced, and improved sensitivity is thus achieved. Further, in electromagnetic wave detector 101 shown in FIG. 5, first ferroelectric layer 4a and second ferroelectric layer 4b can be simultaneously formed by forming a stepped portion on the surface of a single ferroelectric layer formed on substrate 3. This stepped portion can be relatively readily formed by forming a mask pattern on the ferroelectric layer with a photolithography method, and then subjecting the ferroelectric layer to any etching process. Thus, the method for manufacturing electromagnetic wave detector 101 shown in FIG. 5 can be simplified as compared to the method for manufacturing electromagnetic wave detector 100, and the method for manufacturing electromagnetic wave detector 101 shown in FIG. 4.

Each of the modifications listed in the first modification described above is also permitted in electromagnetic wave detector 101, as in electromagnetic wave detector 100.

Figure 6:
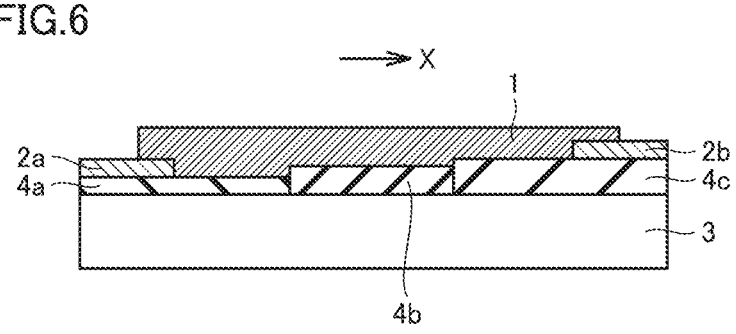
FIG. 6 is a cross-sectional view illustrating a second modification of the electromagnetic wave detector according to the second embodiment.

For example, as shown in FIG. 6, electromagnetic wave detector 101 may further include third ferroelectric layer 4c. Third ferroelectric layer 4c has a thickness greater than that of second ferroelectric layer 4b, for example. The thicknesses of first ferroelectric layer 4a, second ferroelectric layer 4b, and third ferroelectric layer 4c become larger in this order. The materials of first ferroelectric layer 4a, second ferroelectric layer 4b, and third ferroelectric layer 4c may be different from or the same as one another. In this case, a stepped portion is also formed on the boundary between second ferroelectric layer 4b and third ferroelectric layer 4c. Two-dimensional material layer 1 is disposed to cover the stepped portion on the boundary between first ferroelectric layer 4a and second ferroelectric layer 4b, and the stepped portion on the boundary between second ferroelectric layer 4b and third ferroelectric layer 4c.

Third Embodiment

Figures 7, 8, 9:
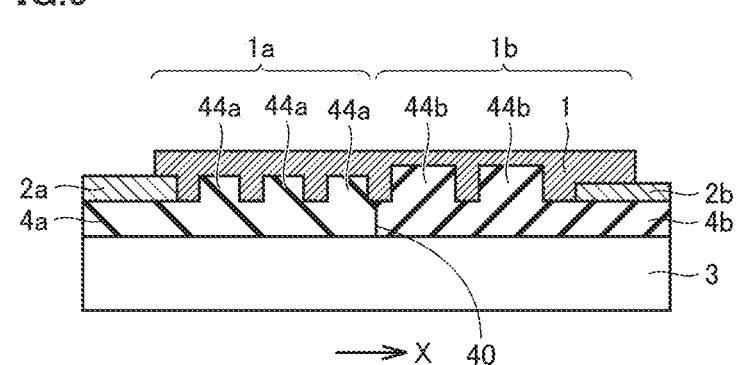
FIG. 7 is a cross-sectional view illustrating an electromagnetic wave detector according to a third embodiment.
FIG. 8 is a plan view illustrating a periodic pattern shape of a plurality of projections and recesses formed on each of a first ferroelectric layer and a second ferroelectric layer, as seen in plan view of the electromagnetic wave detector according to the third embodiment.
FIG. 9 is a cross-sectional view illustrating a modification of the electromagnetic wave detector according to the third embodiment.

As shown in FIG. 7, an electromagnetic wave detector 102 according to a third embodiment has basically the same configuration and the same effect as those of electromagnetic wave detector 100 according to the first embodiment, but is different from electromagnetic wave detector 100 in that at least one of first ferroelectric layer 4a and second ferroelectric layer 4b has an uneven shape. The difference of electromagnetic wave detector 102 from electromagnetic wave detector 100 will be mainly described.

In electromagnetic wave detector 102 shown in FIG. 7, a plurality of first recesses 43a are formed in first ferroelectric layer 4a, a plurality of second recesses 43b are formed in second ferroelectric layer 4b, and one third recess 43c is further formed between first ferroelectric layer 4a and second ferroelectric layer 4b.

As shown in FIG. 8, the plurality of first recesses 43a are periodically disposed side by side in first direction X, and extend along the direction intersecting first direction X. The plurality of second recesses 43b are periodically disposed side by side in first direction X, and extend along the direction intersecting first direction X. One third recess 43c extends along the direction intersecting first direction X. For example, each of the plurality of first recesses 43a, the plurality of second recesses 43b, and third recess 43c extends along second direction Y orthogonal to first direction X.

The boundary between first ferroelectric layer 4a and second ferroelectric layer 4b extends in the direction intersecting first direction X between two third recesses 43c adjacent to each other in second direction Y.

Each of first recesses 43a is recessed from the upper surface of first ferroelectric layer 4a facing two-dimensional material layer 1. Each of second recesses 43b is recessed from the upper surface of second ferroelectric layer 4b facing two-dimensional material layer 1. One third recess 43c is recessed from the upper surface of first ferroelectric layer 4a facing two-dimensional material layer 1 and the upper surface of second ferroelectric layer 4b facing two-dimensional material layer 1. Each of first recesses 43a, each of second recesses 43b, and third recess 43c are formed as through holes, for example. Third recess 43c may not be formed in electromagnetic wave detector 102.

Each of the plurality of first recesses 43a has an opening width and a depth (hereinafter referred to simply as a size) and a spacing, and each of the plurality of second recesses 43b has a size and a spacing, that are smaller than the detection wavelength. The number of first recesses 43a is larger than the number of second recesses 43b, for example. The number of first recesses 43a may be equal to or smaller than the number of second recesses 43b.

First region 1a of two-dimensional material layer 1 is disposed on the plurality of first recesses 43a and one recess 43c. Second region 1b of two-dimensional material layer 1 is disposed on the plurality of second recesses 43b and one recess 43c.

In electromagnetic wave detector 102 shown in FIGS. 7 and 8, the plurality of first recesses 43a and the plurality of second recesses 43b are periodically arranged, which leads to high efficiency of coupling with light of a wavelength determined primarily by the period. As a result, each of first ferroelectric layer 4a and second ferroelectric layer 4b selectively absorbs this wavelength, which can increase both the photobiasing effect and the photogating effect, leading to improved wavelength-selective sensitivity.

Electromagnetic wave detector 102 can be manufactured by basically the same method as that for manufacturing electromagnetic wave detector 100. The method for manufacturing electromagnetic wave detector 102 is different from the method for manufacturing electromagnetic wave detector 100 in that it further includes a step of forming each of the plurality of first recesses 43a, the plurality of second recesses 43b, and third recess 43c. Each of the plurality of first recesses 43a, the plurality of second recesses 43b, and third recess 43c can be relatively readily formed by forming a mask pattern on each ferroelectric layer with a photolithography method, and then subjecting each ferroelectric layer to any etching process.

<Third Modification>

Electromagnetic wave detector 102 can be modified as described below.

As shown in FIG. 9, in electromagnetic wave detector 102, first ferroelectric layer 4a and second ferroelectric layer 4b may be provided with a plurality of first projections 44a and a plurality of second projections 44b, instead of the plurality of first recesses 43a, the plurality of second recesses 43b, and third recess 43c. The plurality of first projections 44a are periodically formed on the surface of first ferroelectric layer 4a, for example. The plurality of second projections 44b are periodically formed on the surface of second ferroelectric layer 4b, for example. First region 1a of two-dimensional material layer 1 is disposed on the plurality of first projections 44a. Second region 1b of two-dimensional material layer 1 is disposed on the plurality of second projections 44b.

Each of first projections 44a and second projections 44b is spaced from boundary 40 in first direction X, for example. First ferroelectric layer 4a and second ferroelectric layer 4b may share a third projection. In this case, boundary 40 is partially formed in the third projection.

Figure 10:
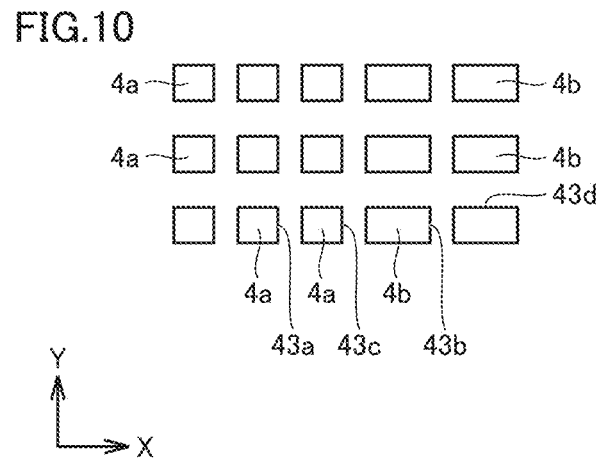
FIG. 10 is a plan view illustrating a second example of the periodic pattern shape of the plurality of projections and recesses formed on each of the first ferroelectric layer and the second ferroelectric layer, as seen in plan view of the electromagnetic wave detector according to the third embodiment.

As shown in FIG. 10, the plurality of projections and recesses in electromagnetic wave detector 102 may have two-dimensional periodicity. For example, first ferroelectric layer 4a and second ferroelectric layer 4b may be provided with at least one fourth recess 43d extending along first direction X. Fourth recess 43d intersects (for example, is orthogonal to) each of the plurality of first recesses 43a, the plurality of second recesses 43b, and third recess 43c.

In electromagnetic wave detector 102, at least one of first ferroelectric layer 4a and second ferroelectric layer 4b may be provided with one or more projections and recesses. Only first ferroelectric layer 4a may be provided with one or more projections and recesses. Alternatively, only second ferroelectric layer 4b may be provided with one or more projections and recesses.

In electromagnetic wave detector 102, at least one projection and recess may be non-periodically arranged. In this case too, if at least one of the size and the spacing of the projection and recess is sufficiently smaller than the detection wavelength, reflection of an electromagnetic wave by at least one of first ferroelectric layer 4a and second ferroelectric layer 4b is suppressed. As a result, at least one of first ferroelectric layer 4a and second ferroelectric layer 4b selectively absorbs the wavelength, which can increase both the photobiasing effect and the photogating effect, leading to improved wavelength-selective sensitivity.

Electromagnetic wave detector 102 may have the same configuration as that of electromagnetic wave detector 101, except that at least one of first ferroelectric layer 4a and second ferroelectric layer 4b has an uneven shape. Each of the modifications listed in the first modification and the second modification described above is also permitted in electromagnetic wave detector 102.

The material of first ferroelectric layer 4a may be the same as the material of second ferroelectric layer 4b. In this case, at least one of the size and the spacing of each of the plurality of projections and recesses formed in first ferroelectric layer 4a is different from at least one of the size and the spacing of each of the plurality of projections and recesses formed in second ferroelectric layer 4b. Such first ferroelectric layer 4a and second ferroelectric layer 4b can also be defined as members with different voltage changes that occur due to the pyroelectric effect. As a result, electromagnetic wave detector 102 can produce the same effect as that of electromagnetic wave detector 100.

Fourth Embodiment

Figure 11:
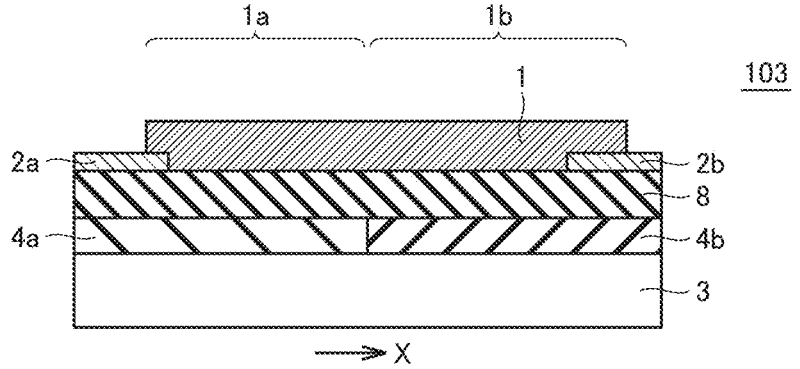
FIG. 11 is a cross-sectional view illustrating an electromagnetic wave detector according to a fourth embodiment.

As shown in FIG. 11, an electromagnetic wave detector 103 according to a fourth embodiment has basically the same configuration and the same effect as those of electromagnetic wave detector 100 according to the first embodiment, but is different from electromagnetic wave detector 100 in that it further includes an insulating layer 8. The difference of electromagnetic wave detector 103 from electromagnetic wave detector 100 will be mainly described.

As shown in FIG. 11, insulating layer 8 is disposed above each of first ferroelectric layer 4a and second ferroelectric layer 4b. Two-dimensional material layer 1, first electrode portion 2a, and second electrode portion 2b are disposed above insulating layer 8. Insulating layer 8 has a region overlapping with first region 1a and a region overlapping with second region 1b in the plan view.

The material of insulating layer 8 is silicon oxide ($SiO_2$), for example. The material of insulating layer 8 is not limited to silicon oxide, and may be, for example, tetraethyl orthosilicate ($Si(OC_2H_5)_4$), silicon nitride ($Si_3N_4$), hafnium oxide ($HfO_2$), aluminum oxide ($Al_2O_3$), nickel oxide (NiO), boron nitride (BN), or a siloxane-based polymeric material. For example, boron nitride (BN) has an atomic arrangement similar to graphene. Therefore, when boron nitride (BN) in in contact with two-dimensional material layer 1 made of graphene, the decrease in electron mobility of two-dimensional material layer 1 is suppressed. Thus, boron nitride (BN) is suitable for insulating layer 8 serving as a base film disposed below two-dimensional material layer 1.

The thickness of insulating layer 8 is not particularly limited, and may be a thickness that produces a tunnel current.

In electromagnetic wave detector 103, insulating layer 8 has the effect of blocking an interaction between pyroelectric polarization generated in each of first ferroelectric layer 4a and second ferroelectric layer 4b and charge in two-dimensional material layer 1. The charge flowing through two-dimensional material layer 1 is less likely to be scattered due to this effect, leading to reduced noise and improved performance of electromagnetic wave detector 103.

Electrically insulating materials such as silicon oxide, silicon nitride, and alumina oxide absorb infrared light having a wavelength of around 10 µm, and generate heat. This heat generation increases the pyroelectric effect, and increases the voltage change, in each of first ferroelectric layer 4a and second ferroelectric layer 4b. As a result, in electromagnetic wave detector 103, both the photobiasing effect and the photogating effect can be increased, leading to improved sensitivity.

Electromagnetic wave detector 103 can be manufactured by basically the same method as that for manufacturing electromagnetic wave detector 100. The method for manufacturing electromagnetic wave detector 103 is different from the method for manufacturing electromagnetic wave detector 100 in that it further includes a step of forming insulating layer 8. Insulating layer 8 is formed by a chemical vapor deposition (CVD) method, a sputtering method or an atomic layer deposition (ALD) method, for example.

<Fourth Modification>

Electromagnetic wave detector 103 can be modified as described below.

Figure 12:
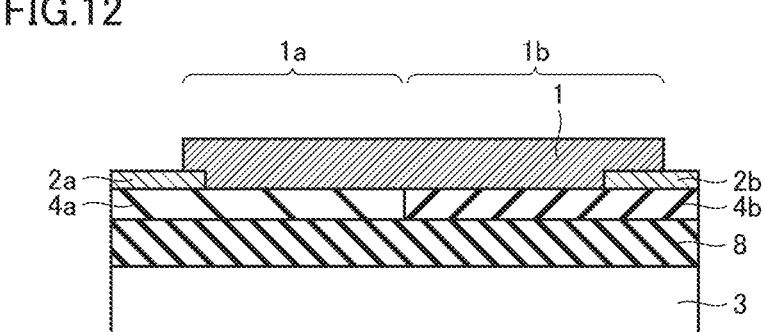
FIG. 12 is a cross-sectional view illustrating a first modification of the electromagnetic wave detector according to the fourth embodiment.

As shown in FIG. 12, insulating layer 8 may be disposed above substrate 3 and below each of first ferroelectric layer 4a and second ferroelectric layer 4b. When the material of substrate 3 includes Si, insulating layer 8 shown in FIG. 12 may be formed by thermally oxidizing substrate 3.

Figures 13, 14, 15:
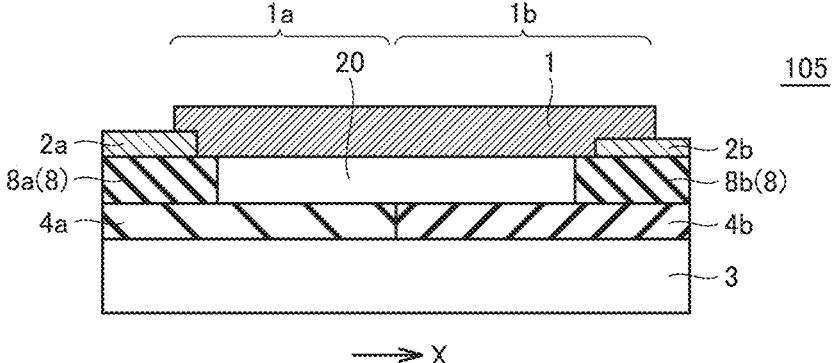
FIG. 13 is a cross-sectional view illustrating a second modification of the electromagnetic wave detector according to the fourth embodiment.
FIG. 14 is a cross-sectional view illustrating an electromagnetic wave detector according to a fifth embodiment.
FIG. 15 is a cross-sectional view illustrating an electromagnetic wave detector according to a sixth embodiment.

As shown in FIG. 13, electromagnetic wave detector 103 may include a pair of insulating layers 8 disposed to sandwich each of first ferroelectric layer 4a and second ferroelectric layer 4b therebetween. The pair of insulating layers 8 includes an upper insulating layer 8 disposed above each of first ferroelectric layer 4a and second ferroelectric layer 4b, and a lower insulating layer 8 disposed below each of first ferroelectric layer 4a and second ferroelectric layer 4b.

As with insulating layer 8 shown in FIG. 11, insulating layer 8 shown in FIG. 12 and the pair of insulating layers 8 shown in FIG. 13 can block the interaction between pyroelectric polarization generated in each of first ferroelectric layer 4a and second ferroelectric layer 4b and charge in two-dimensional material layer 1.

Electromagnetic wave detector 103 may have the same configuration as that of electromagnetic wave detector 101 or electromagnetic wave detector 102, except that it further includes insulating layer 8. Each of the modifications listed in the first modification, the second modification and the third modification described above is also permitted in electromagnetic wave detector 103. For example, insulating layer 8 may be disposed to cover the uneven shape formed on at least one of first ferroelectric layer 4a and second ferroelectric layer 4b.

Electromagnetic wave detector 103 may further include an adhesion layer between first electrode portion 2a or second electrode portion 2b and insulating layer 8 in order to improve the adhesion between them. The material of the adhesion layer includes a metallic material such as chromium (Cr) or titanium (Ti), for example.

Fifth Embodiment

As shown in FIG. 14, an electromagnetic wave detector 104 according to a fifth embodiment has basically the same configuration and the same effect as those of electromagnetic wave detector 100 according to the first embodiment, but is different from electromagnetic wave detector 100 in that it further includes a conductive layer 9. The difference of electromagnetic wave detector 104 from electromagnetic wave detector 100 will be mainly described.

Conductive layer 9 is provided to equalize the potentials of first ferroelectric layer 4*a* and second ferroelectric layer 4*b*. Conductive layer 9 is disposed below each of first ferroelectric layer 4*a* and second ferroelectric layer 4*b*. Conductive layer 9 has a portion overlapping with first region 1*a* and a portion overlapping with second region 1*b* in the plan view. Conductive layer 9 is electrically connected to each of first ferroelectric layer 4*a* and second ferroelectric layer 4*b*. Preferably, conductive layer 9 has a reflectivity for the detection wavelength higher than that of first ferroelectric layer 4*a*.

The material of conductive layer 9 includes, for example, at least one of gold (Au), silver (Ag), copper (Cu), aluminum (Al), nickel (Ni), chromium (Cr), and palladium (Pd). The material of conductive layer 9 may be a two-dimensional material such as graphene or a polymeric material.

Electromagnetic wave detector 104 can be manufactured by basically the same method as that for manufacturing electromagnetic wave detector 100. The method for manufacturing electromagnetic wave detector 104 is different from the method for manufacturing electromagnetic wave detector 100 in that it further includes a step of forming conductive layer 9. Conductive layer 9 is formed by a chemical vapor deposition (CVD) method, a sputtering method or an atomic layer deposition (ALD) method, for example.

In the method for manufacturing electromagnetic wave detector 100, when two-dimensional material layer 1 is formed above first ferroelectric layer 4*a* and second ferroelectric layer 4*b*, charge generated by the polarization in each of first ferroelectric layer 4*a* and second ferroelectric layer 4*b* may inhibit the adhesion between two-dimensional material layer 1 and each of first ferroelectric layer 4*a* and second ferroelectric layer 4*b*, resulting in two-dimensional material layer 1 being peeled off.

In contrast, in the method for manufacturing electromagnetic wave detector 104, when two-dimensional material layer 1 is formed above first ferroelectric layer 4*a* and second ferroelectric layer 4*b*, charge generated by the polarization in each of first ferroelectric layer 4*a* and second ferroelectric layer 4*b* can escape to conductive layer 9 since conductive layer 9 is electrically connected each of first ferroelectric layer 4*a* and second ferroelectric layer 4*b*, to thereby suppress the peeling of two-dimensional material layer 1.

Further, when conductive layer 9 has a reflectivity for the detection wavelength higher than that of first ferroelectric layer 4*a*, an electromagnetic wave that has passed through each of first ferroelectric layer 4*a* and second ferroelectric layer 4*b* is reflected by conductive layer 9 and reenters each of first ferroelectric layer 4*a* and second ferroelectric layer 4*b*. As a result, each of first ferroelectric layer 4*a* and second ferroelectric layer 4*b* has increased absorption efficiency, which can increase both the photobiasing effect and the photogating effect, leading to improved sensitivity.

<Fifth Modification>

Electromagnetic wave detector 104 may further include an adhesion layer between substrate 3 and conductive layer 9 in order to improve the adhesion between them. The material of the adhesion layer includes a metallic material such as chromium (Cr) or titanium (Ti), for example.

Electromagnetic wave detector 104 may have the same configuration as that of electromagnetic wave detector 101, electromagnetic wave detector 102, or electromagnetic wave detector 103, except that it further includes conductive layer 9. Each of the modifications listed in the first modification through the fourth modification described above is also permitted in electromagnetic wave detector 104.

Sixth Embodiment

As shown in FIG. 15, an electromagnetic wave detector 105 according to a sixth embodiment has basically the same configuration and the same effect as those of electromagnetic wave detector 103 according to the fourth embodiment, but is different from electromagnetic wave detector 103 in that a hollow portion 20 is formed above or below each of first ferroelectric layer 4*a* and second ferroelectric layer 4*b*. The difference of electromagnetic wave detector 105 from electromagnetic wave detector 103 will be mainly described.

Insulating layer 8 includes a first insulating layer 8*a* disposed on first ferroelectric layer 4*a*, and a second insulating layer 8*b* disposed on second ferroelectric layer 4*b*. First insulating layer 8*a* is spaced from second insulating layer 8*b* in first direction X. Two-dimensional material layer 1 spans between first insulating layer 8*a* and second insulating layer 8*b*.

Hollow portion 20 is formed above each of first ferroelectric layer 4*a* and second ferroelectric layer 4*b*. Hollow portion 20 is formed between each of first ferroelectric layer 4*a* and second ferroelectric layer 4*b* and two-dimensional material layer 1, and between first insulating layer 8*a* and second insulating layer 8*b*. Two-dimensional material layer 1, first ferroelectric layer 4*a* and second ferroelectric layer 4*b*, and first insulating layer 8*a* and second insulating layer 8*b* face hollow portion 20. Hollow portion 20 has a region overlapping with first region 1*a* and a region overlapping with second region 1*b* in the plan view.

Hollow portion 20 has a heat insulating property, as compared to first ferroelectric layer 4*a* and second ferroelectric layer 4*b*. The material of the inside of hollow portion 20 may be any material having a thermal conductivity lower than those of the materials of first ferroelectric layer 4*a* and second ferroelectric layer 4*b*, and is air, for example.

Electromagnetic wave detector 105 can be interpreted as a bolometer with two-dimensional material layer 1 as resistance. Generally, a bolometer has a sensitivity that is proportional to a rate of temperature range (temperature coefficient resistance: TCR) of the bolometer resistance, and inversely proportional to thermal conductance. As described above, the thermal conductance of electromagnetic wave detector 105 is reduced by improved heat insulating property via hollow portion 20. As a result, electromagnetic wave detector 105 has improved sensitivity since hollow portion 20 is formed.

Preferably, the spacing between two-dimensional material layer 1 and each of first ferroelectric layer 4*a* and second ferroelectric layer 4*b* that are disposed to sandwich hollow portion 20 therebetween is provided such that a voltage change in each of first ferroelectric layer 4a and second ferroelectric layer 4b extends to two-dimensional material layer 1. Hollow portion 20 is provided such that a voltage change in each of first ferroelectric layer 4a and second ferroelectric layer 4b extends to two-dimensional material layer 1. The spacing is desirably about several microns or less, as in a general bolometer. With such a configuration, electromagnetic wave detector 105 produces the same effect as that of electromagnetic wave detector 100 described above.

Generally, the absolute value of the TCR of a two-dimensional material such as graphene is relatively low at several %/K. In electromagnetic wave detector 105, however, the ratio of the amount of current change to a slight voltage change that occurs in two-dimensional material layer 1 is about 1000 times higher due to the photogating effect described above. Therefore, the absolute value of the TCR of two-dimensional material layer 1 is relatively high at several hundred %/K.

In contrast, the absolute values of the TCR of vanadium oxide and amorphous silicon used in a general bolometer are about several %/K. That is, the sensitivity of electromagnetic wave detector 105 can be increased by a factor of ten or more compared to a general bolometer.

<Sixth Modification>

Electromagnetic wave detector 105 can be modified as described below.

Figure 16:
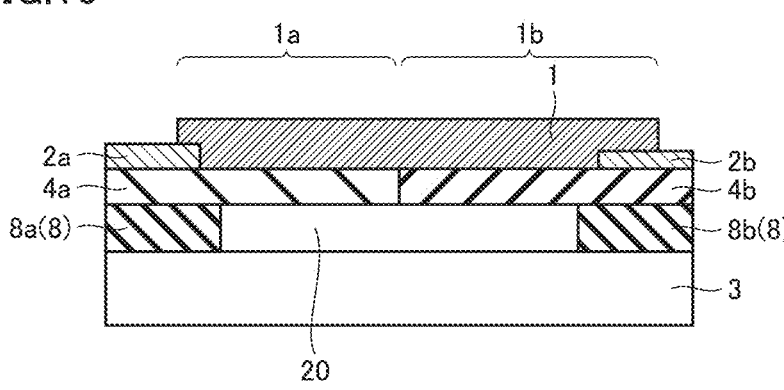
FIG. 16 is a cross-sectional view illustrating a first modification of the electromagnetic wave detector according to the sixth embodiment.

As shown in FIG. 16, hollow portion 20 may be formed below each of first ferroelectric layer 4a and second ferroelectric layer 4b. Hollow portion 20 is formed between substrate 3 and each of first ferroelectric layer 4a and second ferroelectric layer 4b, and between first insulating layer 8a and second insulating layer 8b. Substrate 3, first ferroelectric layer 4a and second ferroelectric layer 4b, and first insulating layer 8a and second insulating layer 8b face hollow portion 20.

Figure 17:
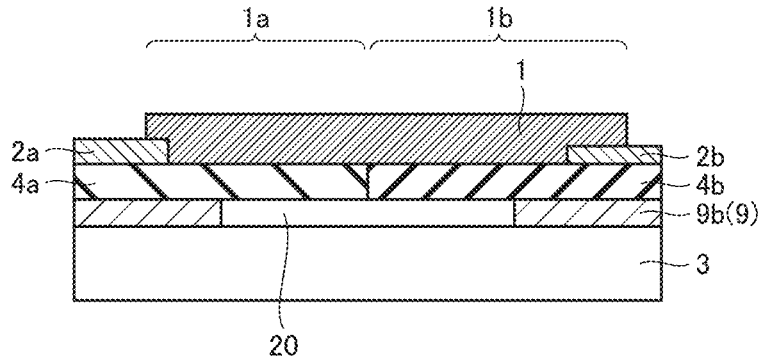
FIG. 17 is a cross-sectional view illustrating a second modification of the electromagnetic wave detector according to the sixth embodiment.

As shown in FIG. 17, electromagnetic wave detector 105 may include a first conductive layer 9a and a second conductive layer 9b, instead of first insulating layer 8a and second insulating layer 8b. Hollow portion 20 is formed below each of first ferroelectric layer 4a and second ferroelectric layer 4b. Hollow portion 20 is formed between substrate 3 and each of first ferroelectric layer 4a and second ferroelectric layer 4b, and between first conductive layer 9a and second conductive layer 9b. Substrate 3, first ferroelectric layer 4a and second ferroelectric layer 4b, and first conductive layer 9a and second conductive layer 9b face hollow portion 20.

Figure 18:
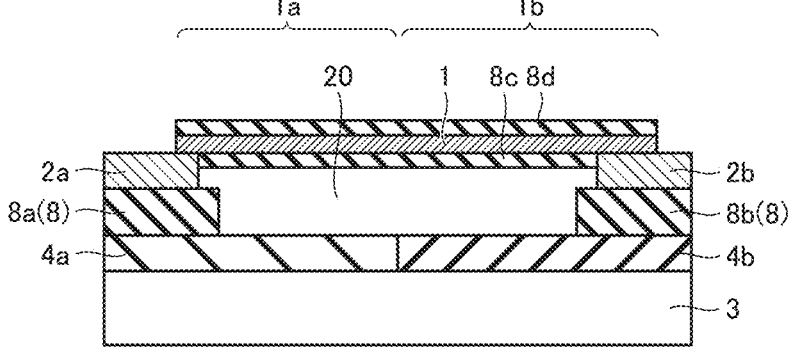
FIG. 18 is a cross-sectional view illustrating a third modification of the electromagnetic wave detector according to the sixth embodiment.

As shown in FIG. 18, electromagnetic wave detector 105 may further include insulating layer 8 disposed in contact with the upper surface or the lower surface of two-dimensional material layer 1. Electromagnetic wave detector 105 may further include a third insulating layer 8c and a fourth insulating layer 8d disposed to sandwich two-dimensional material layer 1 therebetween. Third insulating layer 8c is formed to expose, below two-dimensional material layer 1, a region of two-dimensional material layer 1 to be connected to each of first electrode portion 2a and second electrode portion 2b. Fourth insulating layer 8d is formed above two-dimensional material layer 1. Electromagnetic wave detector 105 may include at least one of third insulating layer 8c and fourth insulating layer 8d.

Electromagnetic wave detector 105 may further include a member that is made of a material capable of producing the photogating effect and that is disposed in contact with hollow portion 20. An example of the material of this member is InSb. Such electromagnetic wave detector 105 is suitable to detect mid-infrared light. Such electromagnetic wave detector 105 produces the same effect as that of electromagnetic wave detector 100 if a slight voltage change occurs in the member made of InSb, even at room temperature.

Electromagnetic wave detector 105 may have the same configuration as that of electromagnetic wave detector 101, electromagnetic wave detector 102, electromagnetic wave detector 103, or electromagnetic wave detector 104, except that hollow portion 20 is formed. Each of the modifications listed in the first modification through the fifth modification described above is also permitted in electromagnetic wave detector 105.

Seventh Embodiment

Figure 19:
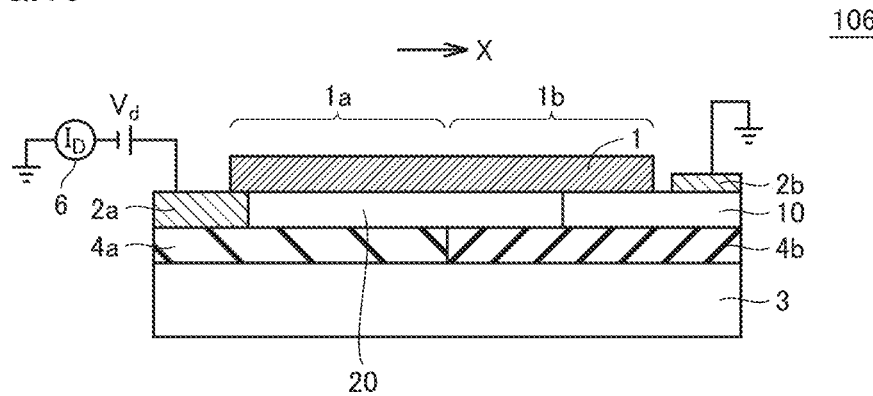
FIG. 19 is a cross-sectional view illustrating an electromagnetic wave detector according to a seventh embodiment.

As shown in FIGS. 19 and 20, an electromagnetic wave detector 106 according to a seventh embodiment has basically the same configuration and the same effect as those of electromagnetic wave detector 100 according to the first embodiment, but is different from electromagnetic wave detector 100 in that it further includes a semiconductor layer 10 disposed above second ferroelectric layer 4b and forming a Schottky junction with second region 1b of two-dimensional material layer 1. The difference of electromagnetic wave detector 106 from electromagnetic wave detector 100 will be mainly described.

Semiconductor layer 10 is disposed on second ferroelectric layer 4b. Semiconductor layer 10 is spaced from first electrode portion 2a in first direction X. Hollow portion 20 is formed between two-dimensional material layer 1 and each of first ferroelectric layer 4a and second ferroelectric layer 4b, and between first electrode portion 2a and semiconductor layer 10. Hollow portion 20 has the same configuration as that of hollow portion 20 in the sixth embodiment. Semiconductor layer 10 has a portion overlapping with second region 1b in the plan view.

Second electrode portion 2b is electrically connected to first electrode portion 2a via first region 1a and second region 1b of two-dimensional material layer 1 and semiconductor layer 10.

Two-dimensional material layer 1 and semiconductor layer 10 form a Schottky junction. A voltage may be further applied between first electrode portion 2a and second electrode portion 2b. Preferably, the voltage is set to be forward biased for the Schottky junction between two-dimensional material layer 1 and semiconductor layer 10. The application of the voltage causes a current to flow through two-dimensional material layer 1 disposed between first electrode portion 2a and second electrode portion 2b. Since the path from first electrode portion 2a to second electrode portion 2b serves as a path for the current flow, two-dimensional material layer 1 also serves as a path for the current flow.

For example, when the material of semiconductor layer 10 is p type silicon (Si) and the material of two-dimensional material layer 1 is n type graphene, two-dimensional material layer 1 and semiconductor layer 10 form a Schottky junction. Therefore, by adjusting the voltage so as to apply a forward bias to the Schottky junction, the amount of change in current flowing through two-dimensional material layer 1 can be amplified, even with slight dielectric polarization in each of first ferroelectric layer 4a and second ferroelectric layer 4b.

In electromagnetic wave detector 106, two-dimensional material layer 1 and semiconductor layer 10 form a Schottky diode. Such a structure is hereinafter referred to as a diode type.

As the material of semiconductor layer 10, a material capable of performing photoelectric conversion is selected depending on the wavelength to be detected. For example, a semiconductor material such as silicon (Si) is used for visible wavelength ranges. Semiconductor layer 10 may be a silicon substrate doped with an impurity or the like.

Semiconductor layer 10 may have a multilayer structure. Semiconductor layer 10 may be a pn junction photodiode, a pin photodiode, a Schottky photodiode, or an avalanche photodiode. Semiconductor layer 10 may be a phototransistor.

Although the material of semiconductor layer 10 is described as a silicon substrate in the present embodiment, the material of semiconductor layer 10 may be any other material. Examples of the material of semiconductor layer 10 include silicon (Si), germanium (Ge), a compound semiconductor such as a group III-V semiconductor or a group II-V semiconductor, mercury cadmium telluride (HgCdTe), indium antimonide (InSb), lead selenide (PbSe), lead sulfide (PbS), cadmium sulfide (CdS), gallium nitride (GaN), silicon carbide (SiC), gallium phosphide (GaP), indium gallium arsenide (InGaAs), and indium arsenide (InAs). Semiconductor layer 10 may be a substrate including a quantum well or a quantum dot. The material of semiconductor layer 10 may be a Type II superlattice. The material of semiconductor layer 10 may be one of the materials described above, or a combination of the materials described above.

Semiconductor layer 10 is desirably doped with an impurity so as to have a resistivity of 100 Ω·cm or less. When semiconductor layer 10 is doped at a high concentration, reading speed (mobility speed) of photocarriers in semiconductor layer 10 is improved, leading to improved response speed of electromagnetic wave detector 100.

Semiconductor layer 10 desirably has a thickness of 10 μm or less. When the thickness of semiconductor layer 10 decreases, deactivation of photocarriers decreases. An adhesion layer (not shown) may be provided between second electrode portion 2b and semiconductor layer 10. The adhesion layer is configured to improve the adhesion. The material of the adhesion layer includes a metallic material such as chromium (Cr) or titanium (Ti), for example.

A method for manufacturing electromagnetic wave detector 106 is different from the method for manufacturing electromagnetic wave detector 100 in that it further includes a step of forming semiconductor layer 10.

Semiconductor layer 10 is formed after first ferroelectric layer 4a and second ferroelectric layer 4b have been formed. Semiconductor layer 10 can be formed by patterning, with a photolithography method, a semiconductor film formed by any film forming method such as sputtering, vapor deposition or CVD. Alternatively, semiconductor layer 10 can be formed by joining a semiconductor layer shaped as a wafer or as a chip to second ferroelectric layer 4b, and then polishing and thinning the semiconductor layer. Further, semiconductor layer 10 can be formed by further patterning such thinned semiconductor layer with a photolithography method. The joining is done by a wafer fusion bonding method, which involves heating, or by a room temperature joining method, which involves direct joining after removal of an oxide film on the surface.

<Operation and Principle of Electromagnetic Wave Detector 100>

In electromagnetic wave detector 106, two-dimensional material layer 1 forms a Schottky junction with semiconductor layer 10. When an electromagnetic wave to be detected enters electromagnetic wave detector 106, electron-hole pairs are generated in semiconductor layer 10 by energy of the electromagnetic wave. At this time, one of the electrons and holes flows into two-dimensional material layer 1 by the bias voltage, causing a current to be generated.

In addition, the electromagnetic wave that has passed through two-dimensional material layer 1 and the electromagnetic wave that has passed outside two-dimensional material layer 1 also enter each of first ferroelectric layer 4a and second ferroelectric layer 4b. In this case, each of first ferroelectric layer 4a and second ferroelectric layer 4b produces the pyroelectric effect, causing a voltage change in the surface of each of first ferroelectric layer 4a and second ferroelectric layer 4b, and a gate voltage change in two-dimensional material layer 1 immediately above these layers.

<Functions and Effects>

In electromagnetic wave detector 106, since two-dimensional material layer 1 forms a Schottky junction with semiconductor layer 10, dark current is suppressed when no electromagnetic wave has entered, as compared to the graphene transistor type without a Schottky junction illustrated in the first embodiment.

The gate voltage of two-dimensional material layer 1 changes due to the pyroelectric effect of each of first ferroelectric layer 4a and second ferroelectric layer 4b. This causes a change in the bias voltage applied between two-dimensional material layer 1 and semiconductor layer 10. If first ferroelectric layer 4a and second ferroelectric layer 4b are disposed such that this bias voltage change increases in the forward direction, current extraction efficiency is improved.

Further, since the photogating effect described above is also produced in electromagnetic wave detector 106, a very large amount of signal change is obtained in electromagnetic wave detector 106.

As described above, in electromagnetic wave detector 106, the amount of signal current change is increased due to the photogating effect, while dark current is suppressed due to the Schottky junction between two-dimensional material layer 1 and semiconductor layer 10, so that a high S/N ratio can be achieved.

Electromagnetic wave detector 106 also produces the same effect as that of electromagnetic wave detector 104 according to the sixth embodiment, since hollow portion 20 is formed. Specifically, two-dimensional material layer 1 is thermally insulated from each of first ferroelectric layer 4a and second ferroelectric layer 4b since hollow portion 20 is formed. In electromagnetic wave detector 106, therefore, two-dimensional material layer 1 is less susceptible to scattering due to electrical and physical responses from first ferroelectric layer 4a and second ferroelectric layer 4b, as compared to electromagnetic wave detector 100. As a result, when the material of two-dimensional material layer 1 includes graphene, for example, the charge mobility is significantly improved as compared to electromagnetic wave detector 100 without hollow portion 20.

In electromagnetic wave detector 106, too, the spacing between two-dimensional material layer 1 and each of first ferroelectric layer 4a and second ferroelectric layer 4b that are disposed to sandwich hollow portion 20 therebetween is desirably provided such that a voltage change in each of in first ferroelectric layer 4a and second ferroelectric layer 4b extends to two-dimensional material layer 1. Hollow portion 20 is provided such that a voltage change in each of first ferroelectric layer 4a and second ferroelectric layer 4b extends to two-dimensional material layer 1. The spacing is desirably about several microns or less, as in a general bolometer. With such a configuration, electromagnetic wave detector 106 produces the same effect as that of electromagnetic wave detector 100 described above.

<Seventh Modification>

Electromagnetic wave detector 106 may have the same configuration as that of electromagnetic wave detector 101, electromagnetic wave detector 102, electromagnetic wave detector 103, or electromagnetic wave detector 104, except that it includes semiconductor layer 10. Each of the modifications listed in the first modification through the sixth modification described above is also permitted in electromagnetic wave detector 106.

Figure 21:
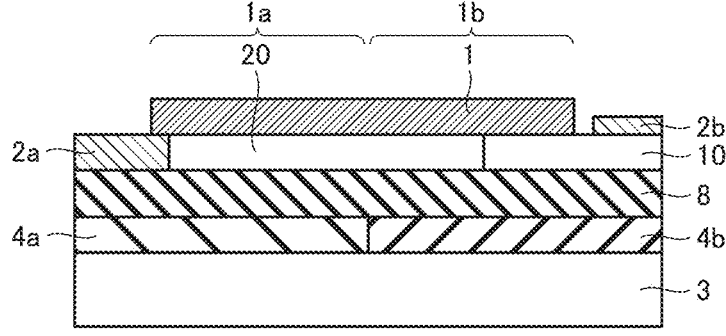
FIG. 21 is a cross-sectional view illustrating a first modification of the electromagnetic wave detector according to the seventh embodiment.

As shown in FIG. 21, electromagnetic wave detector 106 may further include insulating layer 8, as with electromagnetic wave detector 103 according to the fourth embodiment. Insulating layer 8 is disposed above each of first ferroelectric layer 4a and second ferroelectric layer 4b, for example. First electrode portion 2a and semiconductor layer 10 are spaced from each other in first direction X on insulating layer 8.

Eighth Embodiment

Figure 22:
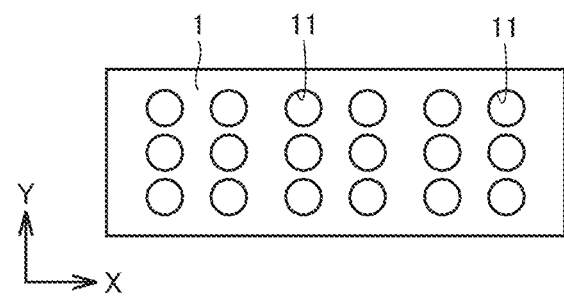
FIG. 22 is a plan view illustrating a first example of a periodic pattern shape of a two-dimensional material layer, as seen in plan view of an electromagnetic wave detector according to an eighth embodiment.

An electromagnetic wave detector according to an eighth embodiment has basically the same configuration and the same effect as those of electromagnetic wave detector 100 according to the first embodiment, but is different from electromagnetic wave detector 100 in that two-dimensional material layer 1 has a periodic pattern shape in the plan view, as shown in FIG. 22. The difference of two-dimensional material layer 1 according to the present embodiment from two-dimensional material layer 1 of electromagnetic wave detector 100 will be mainly described.

Figure 23:
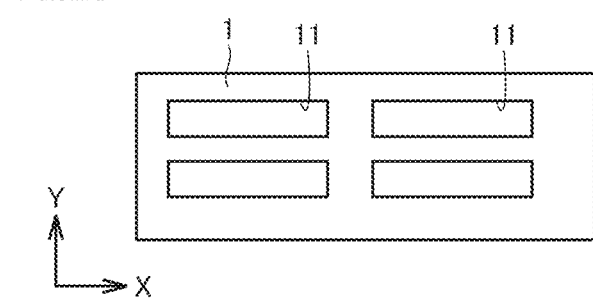
FIG. 23 is a plan view illustrating a second example of the periodic pattern shape of the two-dimensional material layer, as seen in plan view of the electromagnetic wave detector according to the eighth embodiment.

As shown in FIG. 22, two-dimensional material layer 1 is provided with a plurality of through holes 11. The plurality of through holes 11 are periodically arranged in each of first direction X and second direction Y. Each of the plurality of through holes 11 has a circular planar shape (opening shape), for example. Each through hole 11 may have any planar shape. As shown in FIG. 23, each through hole 11 may have a quadrangular planar shape, specifically a square or rectangular planar shape. Each through hole 11 may have an elliptical planar shape. Through holes 11 may have planar shapes different from one another.

As shown in FIGS. 22 and 23, the size of each of the plurality of through holes 11 is constant, for example. The spacing between each of the plurality of through holes 11 in each of first direction X and second direction Y is constant, for example. At least one of the size and the spacing of each of the plurality of through holes 11 may periodically vary in at least one of first direction X and second direction Y. At least one of the size and the spacing of each of the plurality of through holes 11 may non-periodically vary in at least one of first direction X and second direction Y.

As shown in FIGS. 22 and 23, the spacing between each of the plurality of through holes 11 in first direction X may be longer than the spacing between each of the plurality of through holes 11 in second direction Y.

Figure 24:
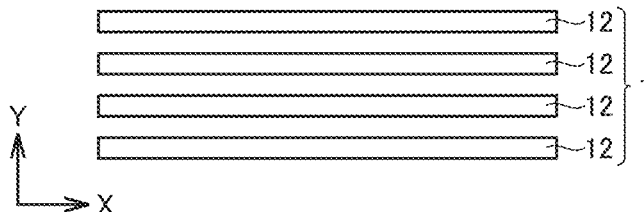
FIG. 24 is a plan view illustrating a third example of the periodic pattern shape of the two-dimensional material layer, as seen in plan view of the electromagnetic wave detector according to the eighth embodiment.

As shown in FIG. 24, two-dimensional material layer 1 may be formed by a plurality of two-dimensional material layers 12 spaced from one another side by side in second direction Y. Each of two-dimensional material layers 12 extends along first direction X. Each of two-dimensional material layers 12 includes the first region and the second region described above that are disposed side by side in first direction X.

As shown in FIG. 24, the size of each of two-dimensional material layers 12 is constant, for example. The spacing between each of two-dimensional material layers 12 in second direction Y is constant, for example. At least one of the size and the spacing of each of two-dimensional material layers 12 may periodically vary in second direction Y. At least one of the size and the spacing of each of two-dimensional material layers 12 may non-periodically vary in second direction Y.

Figure 25:
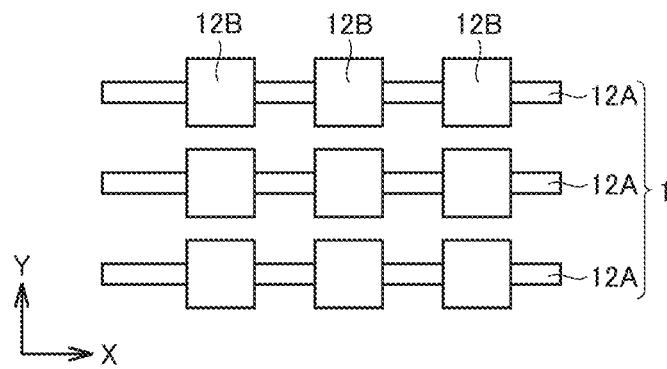
FIG. 25 is a plan view illustrating a fourth example of the periodic pattern shape of the two-dimensional material layer, as seen in plan view of the electromagnetic wave detector according to the eighth embodiment.

As shown in FIG. 25, two-dimensional material layer 1 may include a plurality of two-dimensional material layers 12A periodically arranged in one dimension in second direction Y, and a plurality of two-dimensional material layers 12B periodically arranged in two dimensions in each of first direction X and second direction Y. Each of the plurality of two-dimensional material layers 12B is connected to one two-dimensional material layer 12A. Each of the plurality of two-dimensional material layers 12B is disposed above or below each of the plurality of two-dimensional material layers 12A, for example. Each of the plurality of two-dimensional material layers 12B and each of the plurality of two-dimensional material layers 12A may be integrated into a single layer. The material of two-dimensional material layers 12A may be the same as the material of two-dimensional material layers 12B.

In two-dimensional material layer 1 shown in FIG. 25, plasmon resonance dominantly occurs in the plurality of two-dimensional material layers 12B periodically arranged in two dimensions, and electron-hole pairs generated by photoelectric conversion enhanced by the resonance can reach first electrode portion 2a through the plurality of two-dimensional material layers 12A periodically arranged in one dimension. In this case, polarization-independent photoelectric conversion occurs, leading to improved sensitivity of the electromagnetic wave detector.

As described above, since two-dimensional material layer 1 has a periodic or non-periodic pattern shape, plasmon resonance determined by the pattern occurs. When two-dimensional material layer 1 has a periodic pattern shape, the plasmon resonance has a constant wavelength. When two-dimensional material layer 1 has a non-periodic pattern shape, on the other hand, a plurality of resonances occur, causing the plasmon resonances to have multiple wavelengths. As the wavelength interval of the plasmon resonance decreases, the wavelength of electromagnetic waves that can be absorbed by two-dimensional material layer 1 increases. In this manner, since two-dimensional material layer 1 has a periodic or non-periodic pattern shape, plasmon resonance occurs, leading to increased absorption of electromagnetic waves into two-dimensional material layer 1. For example, as described above, when the material of two-dimensional material layer 1 includes graphene and two-dimensional material layer 1 does not have a periodic or non-periodic pattern shape, two-dimensional material layer 1 has an absorptivity of about 2% for white light, whereas two-dimensional material layer 1 shown in FIGS. 22 to 25 has an absorptivity improved up to 100% for white light. As a result, the electromagnetic wave detector according to the present embodiment has high sensitivity since it includes two-dimensional material layer 1 shown in FIGS. 22 to 25.

Next, the symmetry of the pattern shape of two-dimensional material layer 1 will be described. As shown in FIG. 22, for example, the plurality of through holes 11 are periodically arranged in each of first direction X and second direction Y. The polarization direction of electromagnetic waves that can be detected by an electromagnetic wave detector including such two-dimensional material layer 1 is not limited. As shown in FIG. 24, on the other hand, the plurality of two-dimensional material layers 12A are periodically arranged only in second direction Y. In this case, two-dimensional material layer 1 absorbs only electromagnetic waves having an electric field parallel to second direction Y. As a result, an electromagnetic wave detector including such two-dimensional material layer 1 can detect only specific polarized light, and a polarization image sensor is implemented by arranging a plurality of such electromagnetic wave detectors.

The plasmon resonance wavelength is also affected by the refractive index of the base (substrate 3, first ferroelectric layer 4a and second ferroelectric layer 4b, etc.) of two-dimensional material layer 1. For example, when the material of substrate 3 disposed below two-dimensional material layer 1 includes Si, each of two-dimensional material layers 12A may have a width of 200 nm and a spacing (period) of 300 nm in second direction Y, in order for an electromagnetic wave detector including two-dimensional material layer 1 shown in FIG. 24 to have a detection wavelength in a mid-infrared wavelength range.

The electromagnetic wave detector according to the present embodiment may have the same configuration as that of electromagnetic wave detector 101, electromagnetic wave detector 102, electromagnetic wave detector 103, electromagnetic wave detector 104, or electromagnetic wave detector 105, except that two-dimensional material layer 1 has a periodic pattern shape in the plan view. Each of the modifications listed in the first modification through the seventh modification described above is also permitted in electromagnetic wave detector 107.

Ninth Embodiment

An electromagnetic wave detector according to a ninth embodiment has basically the same configuration and the same effect as those of electromagnetic wave detector 100 according to the first embodiment, but is different from electromagnetic wave detector 100 in that the polarization direction of each of first ferroelectric layer 4a and second ferroelectric layer 4b is specified. The difference of first ferroelectric layer 4a and second ferroelectric layer 4b according to the present embodiment from first ferroelectric layer 4a and second ferroelectric layer 4b of electromagnetic wave detector 100 will be mainly described.

The polarization direction of each of first ferroelectric layer 4a and second ferroelectric layer 4b is a polarization direction called z-cut, in which a potential difference occurs between its upper and lower surfaces (in other words, in the direction perpendicular to the first surface of substrate 3), or a polarization direction called x-cut, in which a potential difference occurs in its in-plane direction (in other words, in first direction X).

In both of the z-cut and the x-cut, the photobiasing effect and the photogating effect described thus far are simultaneously achieved. In the x-cut, however, a change in potential difference in the in-plane direction of each of first ferroelectric layer 4a and second ferroelectric layer 4b is notable, and therefore, the photobiasing effect occurs more notably. In addition, the charge moves relatively fast in the x-cut, and therefore, the response speed increases. One of first ferroelectric layer 4a and second ferroelectric layer 4b may have the z-cut, and the other may have the x-cut. In this case too, the photobiasing effect and the photogating effect are simultaneously achieved.

The electromagnetic wave detector according to the present embodiment may have the same configuration as that of electromagnetic wave detector 101, electromagnetic wave detector 102, electromagnetic wave detector 103, electromagnetic wave detector 104, electromagnetic wave detector 105, or the electromagnetic wave detector according to the eighth embodiment, except that the polarization direction of each of first ferroelectric layer 4a and second ferroelectric layer 4b is specified. Each of the modifications listed in the first modification through the seventh modification described above is also permitted in the electromagnetic wave detector according to the present embodiment.

Tenth Embodiment

An electromagnetic wave detector according to the present embodiment has basically the same configuration as that of electromagnetic wave detector 100 according to the first embodiment, but is different from electromagnetic wave detector 100 in that two-dimensional material layer 1 includes a turbostratic structure portion.

A portion of two-dimensional material layer 1 corresponding to the channel region has a turbostratic structure. Specifically, the portion of two-dimensional material layer 1 corresponding to the channel region has a stacking structure, in which monolayers each including atoms arranged in a two-dimensional plane are stacked on one another. The monolayers extend along first direction X and second direction Y, and are stacked in a direction orthogonal to each of first direction X and second direction Y. In the turbostratic structure portion, the lattices of two monolayers adjacent to each other in the vertical direction are mismatched.

Each of first region 1a and second region 1b of two-dimensional material layer 1 includes the turbostratic structure portion.

A method for producing the turbostratic structure portion may be appropriately determined. For example, monolayer graphene produced by a CVD method may be transferred multiple times to stack multilayer graphene, to thereby form the turbostratic structure portion. Alternatively, ethanol, methane or the like may be disposed as a carbon source on graphene and the graphene may be grown by a CVD method, to thereby form the turbostratic structure portion.

In the electromagnetic wave detector according to the present embodiment, since the portion of two-dimensional material layer 1 corresponding to the channel region has a turbostratic structure, the charge mobility in two-dimensional material layer 1 is improved. Ordinary multilayer graphene is referred to as A-B stacking, in which graphene layers are stacked in the state that the respective lattices of the graphene layers are matched. However, graphene produced by CVD is polycrystalline, and when graphene is further transferred onto the graphene multiple times, or when graphene layers are stacked by CVD with the base graphene being as a core, a turbostratic structure is formed in which the respective lattices of the graphene layers are mismatched. Graphene of the turbostratic structure is less likely to be affected by an interlayer interaction, and has similar properties to monolayer graphene.

Further, when two-dimensional material layer 1 is in contact with insulating layer 8, the graphene is affected by carrier scattering of base insulating layer 8, resulting in reduced mobility. However, graphene layers stacked in the turbostratic structure on the graphene is less likely to be affected by carrier scattering of base insulating layer 8. The mobility can thus be improved, leading to improved sensitivity of the electromagnetic wave detector according to the present embodiment.

The electromagnetic wave detector according to the present embodiment may have the same configuration as that of electromagnetic wave detector 101, electromagnetic wave detector 102, electromagnetic wave detector 103, electromagnetic wave detector 104, electromagnetic wave detector 105, or the electromagnetic wave detector according to the seventh embodiment or the eighth embodiment, except that two-dimensional material layer 1 includes the turbostratic structure portion. Each of the modifications listed in the first modification through the seventh modification described above is also permitted in the electromagnetic wave detector according to the present embodiment.

Eleventh Embodiment

Figure 26:
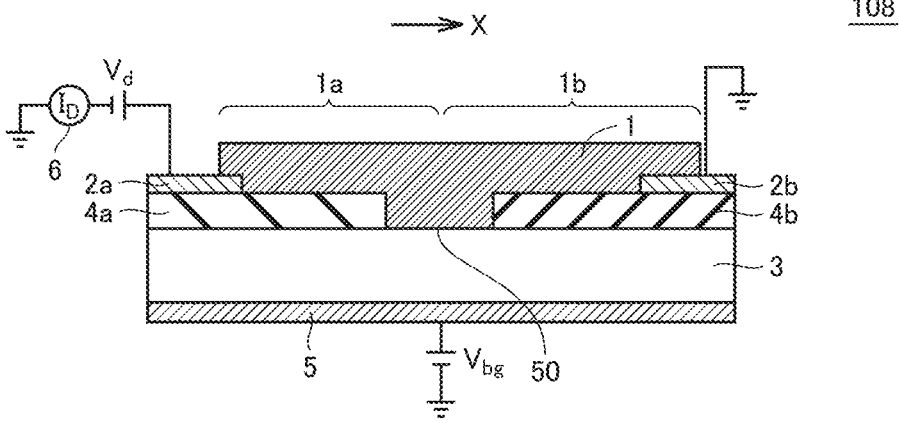
FIG. 26 is a cross-sectional view illustrating an electromagnetic wave detector according to an eleventh embodiment.

As shown in FIG. 26, an electromagnetic wave detector 108 according to an eleventh embodiment has basically the same configuration and the same effect as those of electromagnetic wave detector 100 according to the first embodiment, but is different from electromagnetic wave detectors 100, 101, 103 and 104 in that it includes a contact region 50 in which two-dimensional material layer 1 and substrate 3 are in direct contact with each other, and that the boundary between first ferroelectric layer 4a and second ferroelectric layer 4b is formed by a portion of two-dimensional material layer 1 that is in contact with substrate 3 in contact region 50, and an end face of each of first ferroelectric layer 4a and second ferroelectric layer 4b facing each other with this portion interposed therebetween.

From a different viewpoint, electromagnetic wave detector 108 is different from electromagnetic wave detectors 100, 101, 103 and 104 in that the first end portion of first ferroelectric layer 4a located on the second region 1b side in first direction X is not in contact with the second end portion of second ferroelectric layer 4b located on the first region 1a side in first direction X, and that the first end portion and the second end portion are connected via two-dimensional material layer 1. The difference of electromagnetic wave detector 108 from electromagnetic wave detectors 100, 101, 103 and 104 will be mainly described.

As shown in FIG. 26, electromagnetic wave detector 108 includes contact region 50 in which two-dimensional material layer 1 and substrate 3 are in contact with each other. Contact region 50 is formed between first ferroelectric layer 4a and second ferroelectric layer 4b. Two-dimensional material layer 1 forms a Schottky junction with substrate 3 in contact region 50.

In electromagnetic wave detector 108, the end face of the first end portion of first ferroelectric layer 4a and the end face of the second end portion of second ferroelectric layer 4b are in contact with two-dimensional material layer 1.

Electromagnetic wave detector 108 shown in FIG. 26 includes first electrode portion 2a serving as a drain electrode, and second electrode portion 2b serving as a source electrode.

Contact region 50 can be formed by partially etching at least one of first ferroelectric layer 4a and second ferroelectric layer 4b to expose substrate 3, and then transferring two-dimensional material layer 1 onto substrate 3, first ferroelectric layer 4a and second ferroelectric layer 4b. Since two-dimensional material layer 1 is elastic, two-dimensional material layer 1 formed by this method can deform along the surface of projections and recesses formed therebelow due to interatomic forces, to come into contact with substrate 3. Contact failure between two-dimensional material layer 1 and substrate 3 is unlikely to occur in contact region 50.

In electromagnetic wave detector 108 shown in FIG. 26, too, a voltage change that occurs in first ferroelectric layer 4a is different from a voltage change that occurs in second ferroelectric layer 4b, and therefore, different voltages are applied to first region 1a and second region 1b of two-dimensional material layer 1. That is, in electromagnetic wave detector 108, a bias voltage similar to a PN junction is applied in a pseudo manner within two-dimensional material layer 1. On the other hand, since charge is injected into two-dimensional material layer 1 from substrate 3, the charge injected into two-dimensional material layer 1 is extracted, due to the photobiasing effect described above, from the source electrode and the drain electrode with two-dimensional material layer 1 serving as a channel. When two-dimensional material layer 1 is graphene, the charge mobility is about 100 times higher than that of silicon, for example. Thus, the mobility of the charge injected into graphene of two-dimensional material layer 1 is significantly different from the mobility of the charge in substrate 3, causing a gain to be generated. In this case, an output signal extracted is about 100 times larger than an output signal extracted in an electromagnetic wave detector including a general channel made of silicon. This effect is referred to as a quantum gain. As described above, electromagnetic wave detector 108 can have further improved performance since it includes contact region 50 in which two-dimensional material layer 1 and substrate 3 are in contact with each other.

Electromagnetic wave detector 108 may further include a barrier layer between two-dimensional material layer 1 and substrate 3 in contact region 50. This barrier layer has the effect of increasing a photoswitching effect, thereby attaining further improved photodetection performance.

Figure 27:
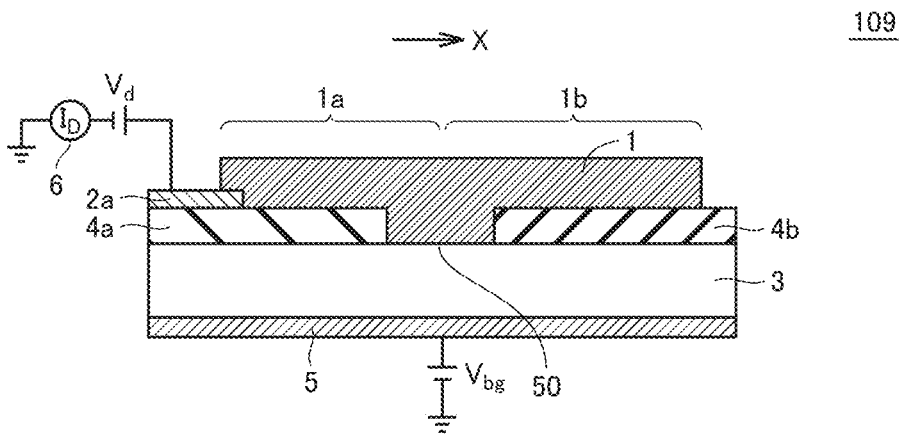
FIG. 27 is a cross-sectional view illustrating a first modification of the electromagnetic wave detector according to the eleventh embodiment.

An electromagnetic wave detector 109 shown in FIG. 27 is a first modification of electromagnetic wave detector 108. Electromagnetic wave detector 109 is different from electromagnetic wave detector 108 in that it does not include second electrode portion 2b. Electromagnetic wave detector 109 operates as a Schottky diode using the Schottky junction between two-dimensional material layer 1 and semiconductor layer 10. Electromagnetic wave detector 109 may include, as electrodes, only first electrode portion 2a as a drain electrode and third electrode portion 5 as a back gate electrode.

In electromagnetic wave detector 109, two-dimensional material layer 1 forms a Schottky junction with substrate 3, and has a Schottky barrier determined by a difference between the Fermi level of two-dimensional material layer 1 and the Fermi level of substrate 3. Thus, dark current can be suppressed when no electromagnetic wave has entered, leading to reduced noise.

When irradiated with an electromagnetic wave, on the other hand, a voltage change that occurs in first ferroelectric layer 4a is different from a voltage change that occurs in second ferroelectric layer 4b, and therefore, different voltages are applied to first region 1a and second region 1b of two-dimensional material layer 1, as described above. That is, a bias voltage similar to a PN junction is applied in a pseudo manner within two-dimensional material layer 1 in electromagnetic wave detector 109, and a bias voltage is applied between two-dimensional material layer 1 and substrate 3. The charge extraction efficiency is thus improved, leading to increased sensitivity. Further, when the material of two-dimensional material layer 1 is graphene, the Fermi level of two-dimensional material layer 1 significantly changes due to the pyroelectric effect of each of first ferroelectric layer 4a and second ferroelectric layer 4b, as described above. In electromagnetic wave detector 109, therefore, an even larger output current can be extracted from the drain electrode when irradiated with an electromagnetic wave, as compared to an electromagnetic wave detector which uses a Schottky junction between metal and semiconductor but do not use the pyroelectric effect by a ferroelectric layer. This effect is referred to as a photogating effect or a photoswitching effect. The output current from electromagnetic wave detector 109 can be increased by a factor of about 100 or more in terms of quantum efficiency due to this effect, as compared to an electromagnetic wave detector which uses a Schottky junction between metal and semiconductor but do not use the pyroelectric effect by a ferroelectric layer. Further, since electromagnetic wave detector 109 has two terminals, the electrical connection structure between each terminal and the readout circuit is simplified as compared to an electromagnetic wave detector with three terminals. As a result, electromagnetic wave detector 109 can have a smaller size and smaller components even when arrayed.

Figure 28:
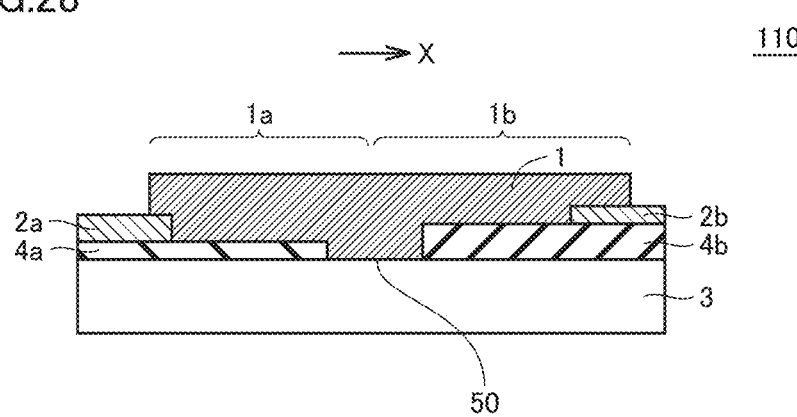
FIG. 28 is a cross-sectional view illustrating a second modification of the electromagnetic wave detector according to the eleventh embodiment.

An electromagnetic wave detector 110 shown in FIG. 28 is a second modification of electromagnetic wave detector 108. Electromagnetic wave detector 110 is different from electromagnetic wave detector 108 in that first ferroelectric layer 4a has a thickness different from that of second ferroelectric layer 4b. In other words, electromagnetic wave detector 110 is different from electromagnetic wave detector 101 in that it includes contact region 50.

Figure 29:
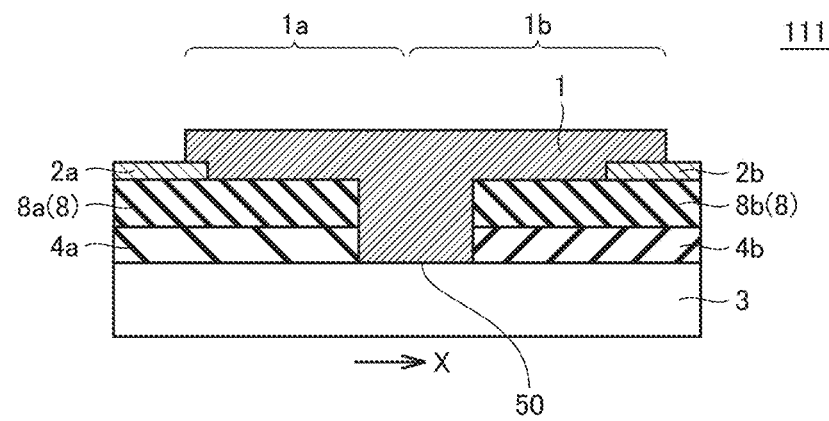
FIG. 29 is a cross-sectional view illustrating a third modification of the electromagnetic wave detector according to the eleventh embodiment.

An electromagnetic wave detector 111 shown in FIG. 29 is a third modification of electromagnetic wave detector 108. Electromagnetic wave detector 111 is different from electromagnetic wave detector 108 in that it further includes insulating layer 8. In other words, electromagnetic wave detector 111 is different from electromagnetic wave detector 103 in that it includes contact region 50. In electromagnetic wave detector 111, insulating layer 8 includes first insulating layer 8a formed on first ferroelectric layer 4a, and second insulating layer 8b formed on second ferroelectric layer 4b. First insulating layer 8a is spaced from second insulating layer 8b. First insulating layer 8a and second insulating layer 8b are disposed to sandwich contact region 50 therebetween in the plan view.

Figure 30:
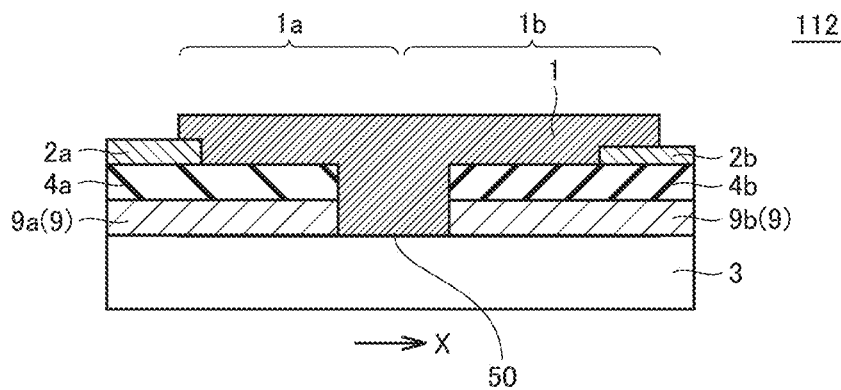
FIG. 30 is a cross-sectional view illustrating a fourth modification of the electromagnetic wave detector according to the eleventh embodiment.

An electromagnetic wave detector 112 shown in FIG. 30 is a fourth modification of electromagnetic wave detector 108. Electromagnetic wave detector 112 is different from electromagnetic wave detector 108 in that it further includes conductive layer 9. In other words, electromagnetic wave detector 112 is different from electromagnetic wave detector 104 in that it includes contact region 50. In electromagnetic wave detector 112, conductive layer 9 includes first conductive layer 9a formed on first ferroelectric layer 4a, and second conductive layer 9b formed on second ferroelectric layer 4b. First conductive layer 9a is spaced from second conductive layer 9b. First conductive layer 9a and second conductive layer 9b are disposed to sandwich contact region 50 therebetween in the plan view.

Electromagnetic wave detectors 109 to 112 shown in FIGS. 27 to 30 can operate in a similar manner to electromagnetic wave detector 108. Electromagnetic wave detectors 110 to 112 shown in FIGS. 28 to 30 may include first electrode portion 2a and third electrode portion 5 without including second electrode portion 2b, in a similar manner to electromagnetic wave detector 109 shown in FIG. 27.

Twelfth Embodiment

An electromagnetic wave detector array 200 according to a twelfth embodiment includes a plurality of the electromagnetic wave detectors according to any one of the first to eleventh embodiments as detection elements. Electromagnetic wave detector array 200 shown in FIG. 31 includes a plurality of electromagnetic wave detectors 100. The plurality of electromagnetic wave detectors 100 are periodically arranged in each of first direction X and second direction Y, for example. The plurality of electromagnetic wave detectors 100 are arranged in a 2×2 array, for example.

The number and arrangement of electromagnetic wave detectors 100 are not limited as such. The plurality of electromagnetic wave detectors 100 may be arranged in an array along at least one of first direction X and second direction Y. The plurality of electromagnetic wave detectors 100 may be non-periodically arranged.

The detection wavelengths for which the plurality of electromagnetic wave detectors 100 have sensitivities are equal to one another, for example. The detection wavelengths for which the plurality of electromagnetic wave detectors 100 have sensitivities may be different from one another. In other words, the plurality of electromagnetic wave detectors 100 may have detection wavelength selectivities different from one another. In this case, electromagnetic wave detector array 200 can detect electromagnetic waves of at least two or more different wavelengths.

In electromagnetic wave detector array 200, one second electrode portion 2b (see FIG. 1) may be used as a common electrode as long as first ferroelectric layer 4a and second ferroelectric layer 4b of each of the plurality of electromagnetic wave detectors 100 are separated from each other. This can reduce the amount of wiring for electromagnetic wave detector array 200 as compared to when there are a plurality of independent second electrode portions 2b, leading to improved resolution of electromagnetic wave detector array 200.

Figures 31, 32:
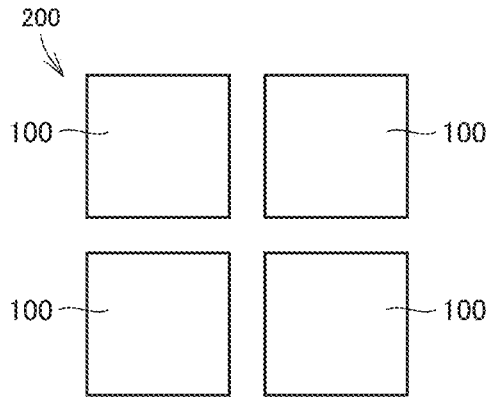
FIG. 31 is a plan view illustrating an electromagnetic wave detector array according to a twelfth embodiment.
FIG. 32 is a cross-sectional view illustrating a connection structure between one electromagnetic wave detector of the electromagnetic wave detector array according to the twelfth embodiment and a readout circuit.

FIG. 32 is a cross-sectional view illustrating a connection structure between one electromagnetic wave detector 100 of electromagnetic wave detector array 200 and a readout circuit 300. As shown in FIG. 32, electromagnetic wave detector 100 may further include an insulating layer 13 disposed to cover two-dimensional material layer 1, an extended electrode 2c electrically connected to first electrode portion 2a and extended on insulating layer 13, and a pad 14 disposed on insulating layer 13 and extended electrode 2c. Two-dimensional material layer 1 is electrically insulated from extended electrode 2c. Pad 14 is electrically connected to readout circuit 300 via a bump 15. In other words, electromagnetic wave detector 100 and the readout circuit form a so-called hybrid junction. The connection structure shown in FIG. 32 is suitable when the material of substrate 3 is other than Si.

In this case, the material of bump 15 may be a conductive material. An example of the conductive material is indium, but is not limited as such. The material of pad 14 is a conductive material such as aluminum silicon, nickel, or gold. Readout circuit 300 is of a capacitive transimpedance amplifier (CTIA) type or the like, but is not limited to this type and may be of any other type.

Figure 33:
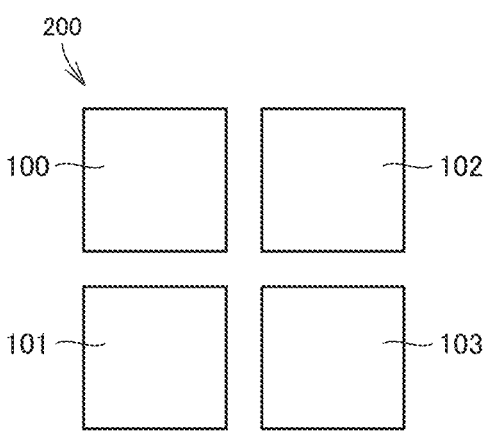
FIG. 33 is a plan view illustrating a modification of the electromagnetic wave detector array according to the twelfth embodiment.

Electromagnetic wave detector array 200 may include electromagnetic wave detectors of different types from one another. The plurality of electromagnetic wave detectors included in electromagnetic wave detector array 200 shown in FIG. 33 are electromagnetic wave detectors 100 to 103 of different types from one another. Electromagnetic wave detectors 100 to 103 of different types from one another may be arranged in an array along at least one of first direction X and second direction Y. The detection wavelengths for which the plurality of electromagnetic wave detectors 100 to 103 have sensitivities may be different from one another. In other words, the plurality of electromagnetic wave detectors 100 to 103 may have detection wavelength selectivities different from one another. A combination of the plurality of types of electromagnetic wave detectors included in electromagnetic wave detector array 200 can be arbitrarily selected from the electromagnetic wave detectors according to the first to eleventh embodiments.

By arranging any of the electromagnetic wave detectors according to the first to eleventh embodiments in an array, electromagnetic wave detector array 200 can function as an image sensor.

By arranging electromagnetic wave detectors having different detection wavelengths in an array in this manner, a wavelength can also be identified in the wavelength ranges of ultraviolet light, infrared light, terahertz waves, and electric waves, as in an image sensor used in the visible light range, to provide a color image.

First ferroelectric layers 4a of electromagnetic wave detectors 100 to 103 may have absorption wavelengths different from one another. When electromagnetic wave detector array 200 including such electromagnetic wave detectors 100 to 103 is applied to a vehicle-mounted sensor, electromagnetic wave detector array 200 can be used as a visible light image camera in the daytime, and as an infrared camera in the nighttime. This eliminates the need to use different cameras with image sensors depending on the detection wavelength of an electromagnetic wave.

Electromagnetic wave detector array 200 may also be used in applications other than image sensors. Electromagnetic wave detector array 200 can be used as a position detection sensor capable of detecting the position of an object even with a small number of pixels. Electromagnetic wave detector array 200 can also be used, for example, as an image sensor capable of detecting the intensities of electromagnetic waves of a plurality of wavelengths. Thus, a plurality of electromagnetic waves can be detected without using a color filter, which has been conventionally required in a complementary MOS (CMOS) sensor or the like, to provide a color image.

The plurality of electromagnetic wave detectors 100 to 103 may be configured to detect electromagnetic waves having different polarizations from one another. For example, polarization imaging can be achieved by disposing a plurality of electromagnetic wave detectors based on four pixels as one unit, the four pixels detecting polarization angles of 0°, 90°, 45° and 135°. The polarization identification image sensor enables, for example, identification between an artificial object and a natural object, identification of a material, identification of a plurality of objects having the same temperature in an infrared wavelength range, identification of a boundary between a plurality of objects, and improvement in equivalent resolution.

Based on the foregoing, the electromagnetic wave detector according to the present embodiment configured as described above can detect electromagnetic waves in a wide wavelength range. The electromagnetic wave detector according to the present embodiment can also provide an electromagnetic wave detector capable of detecting electromagnetic waves of different wavelengths.

In the present invention, the embodiments can be combined in any way, and the embodiments can be modified or omitted as appropriate, within the scope of the invention. Further, the present invention is not limited to the embodiments described above, and can be modified in various ways in an implementation stage without departing from the gist thereof. Further, the embodiments described above include inventions in various stages, and various inventions can be extracted by appropriately combining a plurality of disclosed constituent elements. It should be understood that the embodiments disclosed herein are illustrative and non-restrictive in every respect. The scope of the present disclosure is defined by the terms of the claims rather than the description above, and is intended to include any modifications within the scope and meaning equivalent to the terms of the claims.

REFERENCE SIGNS LIST 1, 12A, 12B two-dimensional material layer; 1a first region; 1b second region; 1c third region; 2a first electrode portion; 2b second electrode portion; 2c extended electrode; 3 substrate; 4a first ferroelectric layer; 4b second ferroelectric layer; 4c third ferroelectric layer; 5 third electrode portion; 8, 13, 18 insulating layer; 8a first insulating layer; 8b second insulating layer; 8c third insulating layer; 8d fourth insulating layer; 9 conductive layer; 9a first conductive layer; 9b second conductive layer; 10 semiconductor layer; 11 through hole; 14 pad; 15 bump; 20 hollow portion; 40, 41 boundary; 42 stepped portion; 43a first recess; 43b second recess; 43c third recess; 43d fourth recess; 44a first projection; 44b second projection; 50 contact region; 100, 101, 102, 103, 104, 105, 106, 107 electromagnetic wave detector; 200 electromagnetic wave detector array; 300 readout circuit.

The invention claimed is:

1. An electromagnetic wave detector comprising:
a two-dimensional material layer including a first region and a second region disposed side by side in a first direction;
a first electrode portion and a second electrode portion spaced from each other in the first direction and electrically connected to each other via the first region and the second region of the two-dimensional material layer;
a first ferroelectric layer having a portion overlapping with the first region of the two-dimensional material layer in a plan view; and
a second ferroelectric layer having a portion overlapping with the second region of the two-dimensional material layer in the plan view, wherein
a boundary between the first ferroelectric layer and the second ferroelectric layer extends in a direction intersecting the first direction,
a material of each of the first ferroelectric layer and the second ferroelectric layer is a pyroelectric substance,
each of the first ferroelectric layer and the second ferroelectric layer has a polarization direction along the first direction, and
the first ferroelectric layer and the second ferroelectric layer are provided such that, when irradiated with an electromagnetic wave, a voltage change that occurs in the first region is different from a voltage change that occurs in the second region.

2. The electromagnetic wave detector according to claim 1, wherein the material of the first ferroelectric layer has a polarizability different from a polarizability of the material of the second ferroelectric layer.

3. The electromagnetic wave detector according to claim 1, wherein the first ferroelectric layer has a thickness different from a thickness of the second ferroelectric layer.

4. The electromagnetic wave detector according to claim 3, wherein the material of the first ferroelectric layer is identical to the material of the second ferroelectric layer.

5. The electromagnetic wave detector according to claim 1, wherein at least one of the first ferroelectric layer and the second ferroelectric layer is provided with one or more projections and recesses, and at least one of the first region and the second region of the two-dimensional material layer is disposed on the projections and recesses.

6. The electromagnetic wave detector according to claim 1, wherein each of the first ferroelectric layer and the second ferroelectric layer is periodically provided with a plurality of projections and recesses, and each of the first region and the second region of the two-dimensional material layer is disposed on at least one projection and recess of the plurality of projections and recesses.

7. The electromagnetic wave detector according to claim 1, further comprising at least one of a first insulating layer in contact with an upper surface of each of the first ferroelectric layer and the second ferroelectric layer, and a second insulating layer in contact with a lower surface of each of the first ferroelectric layer and the second ferroelectric layer.

8. The electromagnetic wave detector according to claim 1, further comprising a conductive layer disposed below each of the first ferroelectric layer and the second ferroelectric layer and electrically connected to each of the first ferroelectric layer and the second ferroelectric layer.

9. The electromagnetic wave detector according to claim 8, wherein the conductive layer has a reflectivity for the electromagnetic wave higher than a reflectivity for the electromagnetic wave of the first ferroelectric layer.

10. The electromagnetic wave detector according to claim 1, further comprising a contact region in which the two-dimensional material layer is in contact with a substrate provided below each of the first ferroelectric layer and the second ferroelectric layer, wherein the boundary is formed by a portion of the two-dimensional material layer that is in contact with the substrate in the contact region, and an end face of each of the first ferroelectric layer and the second ferroelectric layer facing each other with the portion interposed therebetween.

11. The electromagnetic wave detector according to claim 1, wherein a hollow portion is formed above or below each of the first ferroelectric layer and the second ferroelectric layer.

12. The electromagnetic wave detector according to claim 1, further comprising at least one of a voltmeter and an ammeter, wherein the two-dimensional material layer, the first electrode portion, and the second electrode portion are electrically connected in an order of the first electrode portion, the first region of the two-dimensional material layer, the second region of the two-dimensional material layer, and the second electrode portion, the first ferroelectric layer is disposed such that resistance between the first electrode portion and the second electrode portion changes when polarization in the first ferroelectric layer changes, the second ferroelectric layer is disposed such that resistance between the first electrode portion and the second electrode portion changes when polarization in the second ferroelectric layer changes, and at least one of the voltmeter and the ammeter detects the electromagnetic wave by detecting a change in at least one of a voltage of a current and the current, the current flowing between the first electrode portion and the second electrode portion.

13. An electromagnetic wave detector comprising:

a two-dimensional material layer including a first region and a second region disposed side by side in a first direction;

a first electrode portion and a second electrode portion spaced from each other in the first direction and electrically connected to each other via the first region and the second region of the two-dimensional material layer;

a first ferroelectric layer having a portion overlapping with the first region of the two-dimensional material layer in a plan view; and a second ferroelectric layer having a portion overlapping with the second region of the two-dimensional material layer in the plan view, wherein a boundary between the first ferroelectric layer and the second ferroelectric layer extends in a direction intersecting the first direction, a material of each of the first ferroelectric layer and the second ferroelectric layer is a pyroelectric substance, the first ferroelectric layer and the second ferroelectric layer are provided such that, when irradiated with an electromagnetic wave, a voltage change that occurs in the first region is different from a voltage change that occurs in the second region, the electromagnetic wave detector further comprising a semiconductor layer disposed above the second ferroelectric layer and forming a Schottky junction with the second region of the two-dimensional material layer, wherein the second electrode portion is electrically connected to the first electrode portion via the first region and the second region of the two-dimensional material layer and the semiconductor layer.

14. The electromagnetic wave detector according to claim 1, wherein the two-dimensional material layer has a periodic or non-periodic pattern shape in the plan view.

15. The electromagnetic wave detector according to claim 1, wherein at least one of the first ferroelectric layer and the second ferroelectric layer has a polarization direction along the first direction.

16. The electromagnetic wave detector according to claim 1, wherein each of the first region and the second region of the two-dimensional material layer includes a turbostratic structure portion.

17. The electromagnetic wave detector according to claim 1, wherein the two-dimensional material layer includes any material selected from the group consisting of transition metal dichalcogenide, graphene, black phosphorus, silicene, germanene, graphene nanoribbon, and borophene.

18. An electromagnetic wave detector array comprising a plurality of the electromagnetic wave detectors according to claim 1, wherein the plurality of the electromagnetic wave detectors are disposed side by side along at least one of the first direction and a second direction intersecting the first direction.

19. The electromagnetic wave detector according to claim 13, wherein the material of the first ferroelectric layer has a polarizability different from a polarizability of the material of the second ferroelectric layer.

20. The electromagnetic wave detector according to claim 13, wherein the first ferroelectric layer has a thickness different from a thickness of the second ferroelectric layer.

\* \* \* \* \*